United States Patent
Yoshida

(10) Patent No.: US 8,545,668 B2
(45) Date of Patent: Oct. 1, 2013

(54) SUBSTRATE PROCESSING APPARATUS AND SUBSTRATE PROCESSING METHOD

(75) Inventor: Takeshi Yoshida, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 13/545,685

(22) Filed: Jul. 10, 2012

(65) Prior Publication Data

US 2012/0298152 A1 Nov. 29, 2012

Related U.S. Application Data

(62) Division of application No. 11/396,700, filed on Mar. 31, 2006, now Pat. No. 8,313,609.

(30) Foreign Application Priority Data

| Mar. 31, 2005 | (JP) | 2005-103201 |
| Mar. 31, 2005 | (JP) | 2005-103202 |
| Mar. 31, 2005 | (JP) | 2005-103203 |

(51) Int. Cl.
*H01L 21/304* (2006.01)
*B08B 3/04* (2006.01)

(52) U.S. Cl.
USPC ............. 156/345.18; 156/345.55; 134/104.2

(58) Field of Classification Search
USPC .................. 156/345.55, 345.18; 134/104.2
See application file for complete search history.

(56) References Cited

U.S. PATENT DOCUMENTS

| 5,997,653 | A | 12/1999 | Yamasaka |
| 6,793,769 | B2* | 9/2004 | Kajino et al. ............ 156/345.55 |
| 7,958,898 | B2* | 6/2011 | Yoshida .................... 134/104.2 |
| 2004/0103931 | A1 | 6/2004 | Tsuchiya et al. |
| 2005/0244579 | A1* | 11/2005 | Matsuzawa et al. ......... 427/240 |
| 2006/0222315 | A1* | 10/2006 | Yoshida ...................... 385/147 |

FOREIGN PATENT DOCUMENTS

| JP | 2000-260743 | 9/2000 |
| JP | 2001-267278 | 9/2001 |
| JP | 2002-305173 | 10/2002 |
| JP | 2003-338480 | 11/2003 |
| JP | 2004-031400 | 1/2004 |
| JP | 2004-80054 | 3/2004 |
| JP | 2004-265910 | 9/2004 |
| JP | 2004-265912 | 9/2004 |

* cited by examiner

*Primary Examiner* — Sylvia R MacArthur
(74) *Attorney, Agent, or Firm* — Ostrolenk Faber LLP

(57) ABSTRACT

A substrate processing apparatus comprises a substrate holding mechanism, a process liquid supplying mechanism supplying a process liquid, a first guide portion around the substrate holding mechanism having an upper edge portion extending toward the rotation axis for guiding scattered process to flow down, a second guide portion provided around the substrate holding mechanism outside the first guide portion and having an upper edge portion extending toward the rotation axis as vertically overlapping with the upper edge portion of the first guide portion for further guiding the scattered process liquid to flow down, a recovery channel provided outside and integrally with the first guide portion for recovering the process liquid guided by the second guide portion, and a driving mechanism for moving up and down the first guide portion and the second guide portion independently of each other.

5 Claims, 11 Drawing Sheets

SUBSTRATE PROCESSING APPARATUS AND SUBSTRATE PROCESSING METHOD

CROSS-REFERENCE TO RELATED APPLICATIONS

This present divisional application claims benefit to Ser. No. 11/396,700, filed Mar. 31, 2006, and claims priority to JP 2005-103201, filed Mar. 31, 2005, JP 2005-103202, filed Mar. 31, 2005 and JP 2005-103203, filed Mar. 31, 2005, which are incorporated herein in their entirety.

BACKGROUND OF THE INVENTION

1. Field of the Invention

The present invention relates to a substrate processing apparatus and a substrate processing method for processing a substrate. Examples of the substrate to be processed include semiconductor wafers, glass substrates for liquid crystal display devices, glass substrates for plasma display devices, substrates for optical disks, substrates for magnetic disks, substrates for magneto-optical disks, and substrates for photo masks.

2. Description of Related Art

In production processes for semiconductor devices and liquid crystal display devices, a single substrate processing apparatuses is used for processing a surface of a substrate a semiconductor wafer, a glass substrate for a liquid crystal display panel or the like with a process liquid. For reduction of the consumption of the process liquid, some of the substrate processing apparatuses of this type are adapted to recover the process liquid used for the process of the substrate and reuse the recovered process liquid for the subsequent process.

Such a substrate processing apparatus adapted to reuse the process liquid includes, for example, a spin chuck which horizontally holds and rotates a substrate, a bottomed hollow cylindrical cup in which the spin chuck is accommodated, and a splash guard provided vertically movably with respect to the cup.

The cup has an annular drain channel provided around the spin chuck. The cup further has three annular recovery channels triply concentrically provided around the drain channel. The drain channel is connected to a waste liquid drain for draining the process liquid. The recovery channels are each connected to a recovery drain for guiding the process liquid to a recovery tank.

The splash guard includes four guards vertically and radially overlapped with each other. The guards each have a substantially rotationally symmetrical shape about the rotation axis of the substrate. Upper edge portions of the guards are each inclined upward toward the rotation axis of the substrate. Upper edges of the guards are located in predetermined spaced relation on a cylindrical plane having a center axis aligning with the rotation axis of the substrate. The guards are respectively associated with the recovery channels and the drain channel, and lower edges of the guards are respectively inserted in the recovery channels and the drain channel. That is, the uppermost guard (first guard) is associated with the outermost recovery channel (first channel), and the lower edge of the first guard is inserted in the first recovery channel. A guard (second guard) immediately below the first guard is associated with a recovery channel (second channel) disposed inwardly adjacent to the first recovery channel, and the lower edge of the second guard is inserted in the second recovery channel. A guard (third guard) immediately below the second guard is associated with the innermost recovery channel (third recovery channel inwardly adjacent to the second recovery channel), and the lower edge of the third guard is inserted in the third recovery channel. The lowermost guard (fourth guard) is associated with the drain channel, and the lower edge of the fourth guard is inserted in the drain channel.

A first recovery port is defined between the upper edge of the first guard and the upper edge of the second guard for introducing the process liquid scattered from the substrate into the first recovery channel. A second recovery port is defined between the upper edge of the second guard and the upper edge of the third guard for introducing the process liquid scattered from the substrate into the second recovery channel. A third recovery port is defined between the upper edge of the third guard and the upper edge of the fourth guard for introducing the process liquid scattered from the substrate into the third recovery channel. A drain port is defined between the fourth guard and a bottom surface of the cup for introducing the process liquid scattered from the substrate into the drain channel.

A lift driving mechanism, for example, including a ball screw mechanism and the like is connected to the splash guard. The four guards are moved up and down together by the lift driving mechanism.

In the substrate processing apparatus having the aforesaid construction, plural types of process liquids are sequentially supplied to the surface of the substrate to treat the substrate surface sequentially with the plural types of process liquids. Further, the plural types of process liquids used for the processes are separately recovered.

More specifically, the substrate surface is processed with a first process liquid by supplying the first process liquid to the substrate surface while rotating the substrate by the spin chuck. The first process liquid supplied to the substrate surface is scattered radially outward from the peripheral edge of the substrate by a centrifugal force generated by the rotation of the substrate. At this time, the splash guard is vertically moved to bring the first recovery port into opposed relation to a peripheral edge surface of the substrate, whereby the first process liquid scattered from the peripheral edge of the substrate is introduced into the first recovery port. Then, the first process liquid is recovered into the recovery tank through the recovery drain. Similarly, when a second process liquid is supplied to the substrate surface, the second recovery port is opposed to the peripheral edge surface of the substrate to recover the second process liquid scattered from the substrate. When a third process liquid is supplied to the substrate surface, the third recovery port is opposed to the peripheral edge surface of the substrate to recover the third process liquid scattered from the substrate.

Further, a rinsing operation is performed to rinse the substrate surface with pure water (process liquid) by supplying the pure water to the substrate surface while rotating the substrate by the spin chuck. At this time, the drain port is opposed to the peripheral edge surface of the substrate, whereby the pure water used for the rinsing of the substrate surface is collected in the drain channel and drained from the drain channel through the waste liquid drain.

However, the substrate processing apparatus having the aforesaid construction has several problems.

1. The recovery ports are constantly open. Therefore, even with a predetermined one of the recovery ports and the drain port being opposed to the peripheral edge surface of the substrate, the process liquid scattered from the substrate is liable to enter the other ports (particularly the ports adjacent to the predetermined one port), thereby contaminating the process liquids recovered through the other ports in the corresponding recovery channels. During the process with the first process liquid, for example, the scattered first process liquid is liable to partly enter the second recovery port even with the first recovery port being opposed to the peripheral edge surface of the substrate, thereby contaminating the second process liquid recovered in the second recovery channel. Further, with the first recovery port being opposed to the peripheral edge surface of the substrate, i.e., with the splash guard being located at the lowermost position, the lower edges of the respective guards are inserted in the drain channel and the recover channels to a greater extent, so that gaps between the lower edges of the respective guards and the cup are narrowed. Therefore, the process liquids in the recovery channels and the drain channel are liable to flow into the other channels by the capillary phenomenon.

2. When the lowermost drain port is brought into opposed relation to the peripheral edge surface of the substrate, the splash guard should be moved up a greater distance. Therefore, a greater space should be provided above the cup, so that the apparatus has a greater height.

3. Where types of process liquids to be recovered are increased, the existing cup should be replaced with a cup having a correspondingly increased number of recovery channels, and the existing splash guard should be replaced with a splash guard having a correspondingly increased number of guards. This inevitably results in a significant cost increase. In addition, the height of the splash guard is increased, thereby the vertical movement distance of the splash guard is further increased. This increases the height of the apparatus.

4. The recovery ports are constantly open. Therefore, when the splash guard is moved up or down for performing the rinsing operation immediately after the process with the first or second process liquid or performing the process with the first or second process liquid immediately after the rinsing operation, the process liquid scattered from the substrate is liable to enter a recovery port disposed between the first or second recovery port and the drain port during the upward or downward movement of the splash guard, thereby contaminating the process liquid to be recovered through that recovery port. When the splash guard is moved up for performing the rinsing operation immediately after the process with the second process liquid, for example, the third recovery port is brought into opposed relation to the peripheral edge surface of the substrate during the upward movement of the splash guard. At this time, the second process liquid scattered from the substrate is liable to enter the third recovery port, thereby contaminating the third process liquid to be recovered in the third recovery channel.

A conceivable approach to prevention of the contamination of the process liquids is to stop the rotation of the substrate by the spin chuck during the upward or downward movement of the splash guard. However, if the rotation of the substrate is once stopped, it takes time to increase the rotation speed of the substrate to a predetermined speed (a rotation speed required for the subsequent process), thereby prolonging the substrate process time. This reduces the process throughput. Therefore, the stop of the rotation of the substrate during the upward or downward movement of the splash guard is not a preferred approach to the prevention of the contamination of the process liquid.

5. The rinsing operation is performed after the processes with the first process liquid, the second process liquid and the third process liquid are each performed. Therefore, an atmosphere containing a mist of pure water used for washing away the process liquid used for the preceding process is produced during the rinsing operation. If such an atmosphere remains in the drain channel and around the substrate, the rinsed substrate may be adversely affected. Therefore, the atmosphere around the substrate is preferably sucked through the drain channel so as to be removed by an evacuation line connected to the drain channel for forced evacuation of the drain channel.

However, the drain channel atmospherically communicates with the respective recovery channels. Therefore, if the drain channel is forcibly evacuated, the recovery channels are indirectly evacuated, whereby air streams flowing from the recovery ports to the recovery channels occur. As a result, droplets of the process liquid to be drained into the drain channel enter the recovery channels from the recovery ports, thereby reducing the purities of the process liquids recovered in the respective recovery channels.

SUMMARY OF THE INVENTION

It is a first object of the present invention to provide a substrate processing apparatus which prevents a process liquid recovered in a recovery channel from being contaminated with other process liquids (process liquids which should not be recovered in that recovery channel).

It is a second object of the present invention to provide a substrate processing apparatus which has a reduced height.

It is a third object of the present invention to provide a substrate processing apparatus which can be modified so as to recover an increased types of process liquids without a significant cost increase.

It is a fourth object of the present invention to provide a substrate processing apparatus which, when recovering a process liquid used for a substrate processing, prevents the process liquid from being contaminated with other process liquids without reduction of the process throughput.

It is a fifth object of the present invention to provide a substrate processing method which ensures that a process liquid used for a substrate process is recovered without contamination of the process liquid with other process liquids and the substrate processing is properly performed even by reusing the recovered process liquid.

It is a sixth object of the present invention to provide a substrate processing apparatus which is capable of forcibly evacuating a drain channel and yet recovering a process liquid at an improved purity in a recovery channel.

An inventive substrate processing apparatus for achieving the first, second and third objects described above comprises a substrate holding mechanism which generally horizontally holds a substrate and rotates the substrate about a generally vertical rotation axis, a process liquid supplying mechanism for supplying a process liquid to the substrate held by the substrate holding mechanism, a first guide portion provided around the substrate holding mechanism and having an upper edge portion extending toward the rotation axis for guiding the process liquid scattered from the substrate rotated by the substrate holding mechanism to cause the process liquid to flow down, a second guide portion provided around the substrate holding mechanism outside the first guide portion and having an upper edge portion extending toward the rotation axis as vertically overlapping with the upper edge portion of the first guide portion for guiding the process liquid scattered from the substrate rotated by the substrate holding mechanism to cause the process liquid to flow down, a recovery channel provided outside the first guide portion integrally with the first guide portion for recovering the process liquid guided by the second guide portion, and a driving mechanism for moving up and down the first guide portion and the second guide portion independently of each other.

With this arrangement, the first guide portion and the second guide portion doubly surround the substrate holding mechanism. The second guide portion is disposed outside the first guide portion with the upper edge portion thereof vertically overlapping with the upper edge portion of the first guide portion. The recovery channel for recovering the process liquid guided by the second guide portion is provided outside the first guide portion integrally with the first guide portion.

The first guide portion and the second guide portion can be moved up and down independently of each other by the driving mechanism. Therefore, the first guide portion and the second guide portion are vertically moved so as to locate the upper edge portions of the first guide portion and the second guide portion at a lower level than the substrate, to locate the upper edge portion of the first guide portion at a lower level than the substrate and locate the upper edge portion of the second guide portion at a higher level than the substrate, or to locate the upper edge portions of the first guide portion and the second guide portion at a higher level than the substrate.

Where the upper edge portion of the first guide portion is located at a lower level than the substrate and the upper edge portion of the second guide portion is located at a higher level than the substrate, an opening is defined between the upper edge portion of the first guide portion and the upper edge portion of the second guide portion in opposed relation to a peripheral edge surface of the substrate. Therefore, the process liquid scattered from the substrate is introduced into the opening between the upper edge portion of the first guide portion and the upper edge portion of the second guide portion, and the introduced process liquid is guided by the second guide portion to be recovered in the recovery channel. By moving up the first guide portion from this state with the second guide portion kept still to locate the upper edge portions of the first guide portion and the second guide portion at a higher level than the substrate, the first guide portion is brought into opposed relation to the peripheral edge surface of the substrate. Thus, the process liquid scattered from the substrate can be guided by the first guide portion to flow down.

When the process liquid is to be guided by the first guide portion, the first guide portion is moved up to the vicinity of the second guide portion with a very small gap being defined between the upper edge portion thereof and the upper edge portion of the second guide portion. Thus, the process liquid scattered from the substrate is guided by the first guide portion to flow down, while being prevented from intruding into the gap between the upper edge portion of the first guide portion and the upper edge portion of the second guide portion. In addition, the first guide portion and the second guide portion do not contact each other, so that a problem associated with particles which may otherwise be generated by the contact can be eliminated. Further, the process liquid is isolated from the recovery channel by the first guide portion when being guided by the first guide portion. Hence, there is no possibility that the process liquid flows into the recovery channel by the capillary phenomenon. Therefore, a process liquid different from the process liquid to be recovered in the recovery channel is prevented from entering the recovery channel. As a result, the purity of the process liquid recovered in the recovery channel can be improved.

When the process liquid is to be guided by the first guide portion, there is no particular need to move up the second guide portion, but the second guide portion may be located at the same position as assumed for guiding the process liquid. Hence, there is no need to provide a greater space above the recovery channel, thereby the height of the apparatus is correspondingly reduced.

Where the types of process liquids to be recovered is increased, a guide portion is additionally provided around the second guide portion outside the second guide portion, and a recovery channel for recovering a process liquid to be guided by the additional guide portion is additionally provided integrally with the second guide portion. Therefore, the existing first guide portion and the existing recovery channel can be used, so that a significant cost increase can be avoided. That is, the apparatus can be thus modified so as to recover an increased types of process liquids without a significant cost increase. Further, when the process liquid is to be guided by the first guide portion, there is no particular need to move up the additional guide portion, thereby the increase in the height of the apparatus is avoided.

The inventive substrate processing apparatus for achieving the first to third objects described above preferably further comprises an intrusion preventing portion for preventing the process liquid scattered from the substrate rotated by the substrate holding mechanism from intruding into a space between the first guide portion and the second guide portion when the process liquid is guided by the first guide portion.

The provision of the intrusion preventing portion makes it possible to guide the process liquid scattered from the substrate by the first guide portion to cause the process liquid to flow down while assuredly preventing the process liquid from intruding into the space between the first guide portion and the second guide portion. Therefore, a process liquid different from the process liquid to be recovered in the recovery channel is assuredly prevented from entering the recovery channel. As a result, the purity of the process liquid recovered in the recovery channel can be further improved.

In this case, the intrusion preventing portion is preferably a part of the upper edge portion of the second guide portion folded downward.

With this arrangement, the intrusion preventing portion extends downward from the upper edge of the second guide portion, so that the process liquid scattered from the substrate is prevented from flowing around the intrusion preventing portion and intruding into the space between the first guide portion and the second guide portion. Therefore, when the process liquid guided by the second guide portion is recovered, the recovered process liquid is assuredly prevented from being contaminated with other process liquids. As a result, the purity of the recovered process liquid can be further improved. In addition, the intrusion preventing portion is unitary with the second guide portion, so that the construction of the apparatus is simplified.

An inventive substrate processing apparatus for achieving the fourth object described above comprises a substrate holding mechanism which generally horizontally holds a substrate and rotates the substrate about a generally vertical rotation axis, a process liquid supplying mechanism for supplying a process liquid to the substrate held by the substrate holding mechanism, a first guide portion provided around the substrate holding mechanism and having an upper edge portion extending toward the rotation axis for guiding the process liquid scattered from the substrate rotated by the substrate holding mechanism to cause the process liquid to flow down, a second guide portion provided around the substrate holding mechanism outside the first guide portion and having an upper edge portion extending toward the rotation axis as vertically overlapping with the upper edge portion of the first guide portion for guiding the process liquid scattered from the substrate rotated by the substrate holding mechanism to cause the process liquid to flow down, a driving mechanism for moving up and down the first guide portion and the second guide portion independently of each other, and vertical movement controlling means which controls the driving mechanism to move up and down the first guide portion and the second guide portion in synchronization.

With this arrangement, the first guide portion and the second guide portion doubly surround the substrate holding mechanism. The second guide portion is disposed outside the first guide portion with the upper edge portion thereof vertically overlapping with the upper edge portion of the first guide portion. Although the driving mechanism is adapted to move up and down the first guide portion and the second guide portion independently of each other, the vertical movement controlling means is provided for moving up and down the first guide portion and the second guide portion in synchronization.

Thus, the first guide portion and the second guide portion can be moved up and down in synchronization (simultaneously at the same speed) while being kept in close relation with a very small gap being defined between the upper edge portions of the first and second guide portions. Where the process liquid scattered from the substrate is guided by the first guide portion with the upper edge portions of the first and second guide portions being located at a higher level than the substrate and, from this state, the first guide portion and the second guide portion are moved down in synchronization with the very small gap being defined between the upper edge portions of the first and second guide portions to locate the upper edge portions of the first and second guide portions at a lower level than the substrate, for example, the process liquid scattered from the substrate is prevented from intruding into the gap between the upper edge portions of the first and second guide portions even with the substrate kept rotated by the substrate holding mechanism. Therefore, when the process liquid guided by the second guide portion is recovered, the recovered process liquid is prevented from being contaminated with other process liquids (e.g., the process liquid to be guided by the first guide portion) without reduction of the process throughput. As a result, the purity of the recovered process liquid can be improved.

The inventive substrate processing apparatus for achieving the fourth object described above preferably further comprises an intrusion preventing portion for preventing the process liquid scattered from the substrate rotated by the substrate holding mechanism from intruding into a space between the first guide portion and the second guide portion when the process liquid is guided by the first guide portion.

With the provision of the intrusion preventing portion, the process liquid scattered from the substrate is assuredly prevented from intruding into the space between the first guide portion and the second guide portion when the process liquid is guided by the first guide portion. Therefore, when the process liquid guided by the second guide portion is recovered, the recovered process liquid is assuredly prevented from being contaminated with the other process liquids. As a result, the purity of the recovered process liquid can be further improved.

In this case, the intrusion preventing portion is preferably a part of the upper edge portion of the second guide portion folded downward.

With this arrangement, the intrusion preventing portion extends downward from the upper edge of the second guide portion, so that the process liquid scattered from the substrate is prevented from flowing around the intrusion preventing portion and intruding into the space between the first guide portion and the second guide portion. Therefore, when the process liquid guided by the second guide portion is recovered, the recovered process liquid is assuredly prevented from being contaminated with the other process liquids. As a result, the purity of the recovered process liquid can be further improved. In addition, the intrusion preventing portion is unitary with the second guide portion, so that the construction of the apparatus is simplified.

The inventive substrate processing apparatus for achieving the fourth object described above may further comprise a third guide portion provided around the substrate holding mechanism outside the second guide portion and having an upper edge portion extending toward the rotation axis as vertically overlapping with the upper edge portion of the second guide portion for guiding the process liquid scattered from the substrate rotated by the substrate holding mechanism to cause the process liquid to flow down, wherein the vertical movement controlling means controls the driving mechanism to move up the first guide portion and the second guide portion in synchronization when a process liquid guiding state is shifted from a state in which the process liquid scattered from the substrate rotated by the substrate holding mechanism is guided by the third guide portion to a state in which the process liquid is guided by the first guide portion.

In the state in which the process liquid scattered from the substrate is guided by the third guide portion, the upper edge portions of the first guide portion and the second guide portion are located at a lower level than the substrate, and the upper edge portion of the third guide portion is located at a higher level than the substrate. On the other hand, in the state in which the process liquid scattered from the substrate is guided by the first guide portion, the upper edge portions of the first guide portion, the second guide portion and the third guide portion are located at a higher level than the substrate. When the process liquid guiding state is to be shifted from the state in which the process liquid scattered from the substrate is guided by the third guide portion to the state in which the process liquid is guided by the first guide portion, the first guide portion and the second guide portion are moved up in synchronization with the very small gap being defined between the upper edge portions thereof. Thus, the process liquid scattered from the substrate is prevented from intruding into the gap between the upper edge portions of the first and second guide portions even with the substrate kept rotated by the substrate holding mechanism. Therefore, when the process liquid guided by the second guide portion is recovered, the recovered process liquid is prevented from being contaminated with the process liquid to be guided by the third guide portion without reduction of the process throughput. As a result, the purity of the recovered process liquid can be improved.

In this case, the upper edge portion of the third guide portion preferably has a portion folded downward for preventing the process liquid scattered from the substrate rotated by the substrate holding mechanism from intruding into a space between the second guide portion and the third guide portion when the process liquid is guided by the first guide portion or the second guide portion.

With the provision of the folded portion, the process liquid scattered from the substrate is assuredly prevented from intruding into the space between the second guide portion and the third guide portion when the process liquid is guided by the first guide portion or the second guide portion. Therefore, when the process liquid guided by the third guide portion is recovered, the recovered process liquid is prevented from being contaminated with the process liquid to be guided by the first guide portion or the second guide portion. As a result, the purity of the recovered process liquid can be improved.

Further, the folded portion is unitary with the third guide portion, so that the construction of the apparatus is simplified.

Alternatively, the inventive substrate processing apparatus for achieving the fourth object described above may further comprise a third guide portion provided around the substrate holding mechanism outside the second guide portion and having an upper edge portion extending toward the rotation axis as vertically overlapping with the upper edge portion of the second guide portion for guiding the process liquid scattered from the substrate rotated by the substrate holding mechanism to cause the process liquid to flow down, wherein the first guide portion, the second guide portion and the third guide portion are moved down in synchronization when a process liquid guiding state is shifted from a state in which the process liquid scattered from the substrate rotated by the substrate holding mechanism is guided by the first guide portion to a state in which the process liquid flows over the first guide portion, the second guide portion and the third guide portion to be drained to the outside.

In the state in which the process liquid scattered from the substrate is guided by the first guide portion, the upper edge portions of the first guide portion, the second guide portion and the third guide portion are located at a higher level than the substrate. When the process liquid guiding state is to be shifted from this state to the state in which the process liquid flows over the first guide portion, the second guide portion and the third guide portion to be drained to the outside, the first guide portion, the second guide portion and the third guide portion are moved down in synchronization with very small gaps being defined between the upper edge portions of the first and second guide portions and between the upper edge portions of the second and third guide portions. Thus, the process liquid scattered from the substrate is prevented from intruding into the gaps between the upper edge portions of the first and second guide portions and between the upper edge portions of the second and third guide portions even with the substrate kept rotated by the substrate holding mechanism. Therefore, when the process liquid guided by the second guide portion or the third guide portion is recovered, the recovered process liquid is prevented from being contaminated with a process liquid to be spun out without reduction of the process throughput. As a result, the purity of the recovered process liquid can be improved.

In this case, the upper edge portion of the third guide portion preferably has a portion folded downward for preventing the process liquid scattered from the substrate rotated by the substrate holding mechanism from intruding into a space between the second guide portion and the third guide portion when the process liquid is guided by the first guide portion or the second guide portion.

With the provision of the folded portion, the process liquid scattered from the substrate is assuredly prevented from intruding into the space between the second guide portion and the third guide portion when the process liquid is guided by the first guide portion or the second guide portion. Therefore, when the process liquid guided by the third guide portion is recovered, the recovered process liquid is prevented from being contaminated with the process liquid to be guided by the first guide portion or the second guide portion. As a result, the purity of the recovered process liquid can be improved. Further, the folded portion is unitary with the third guide portion, so that the construction of the apparatus is simplified.

An inventive substrate processing method for achieving the fifth object described above is a method for processing a substrate in a substrate processing apparatus including a substrate holding mechanism which generally horizontally holds the substrate and rotates the substrate about a generally vertical rotation axis, and a first guide portion, a second guide portion and a third guide portion provided around the substrate holding mechanism in an independently vertically movable manner for guiding a process liquid scattered from the substrate rotated by the substrate holding mechanism to cause the process liquid to flow down and respectively having upper edge portions extending toward the rotation axis as vertically overlapping with each other. The method comprises the steps of: rotating the substrate by the substrate holding mechanism; supplying the process liquid to the substrate in the substrate rotating step; and simultaneously moving up the first guide portion and the second guide portion in the process liquid supplying step to shift a process liquid guiding state from a state in which the process liquid scattered from the substrate rotated by the substrate holding mechanism is guided by the third guide portion to a state in which the process liquid is guided by the first guide portion.

According to this method, where the process liquid guided by the second guide portion is recovered, the recovered process liquid is prevented from being contaminated with the process liquid to be guided by the third guide portion without reduction of the process throughput. As a result, the purity of the recovered process liquid can be improved. Therefore, the process of the substrate can be properly performed even by reusing the recovered process liquid.

An inventive substrate processing method for achieving the fifth object described above is a method for processing a substrate in a substrate processing apparatus including a substrate holding mechanism which generally horizontally holds the substrate and rotates the substrate about a generally vertical rotation axis, and a first guide portion, a second guide portion and a third guide portion provided around the substrate holding mechanism in an independently vertically movable manner for guiding a process liquid scattered from the substrate rotated by the substrate holding mechanism to cause the process liquid to flow down and respectively having upper edge portions extending toward the rotation axis as vertically overlapping with each other. The method comprises the steps of: rotating the substrate by the substrate holding mechanism; supplying the process liquid to the substrate in the substrate rotating step; simultaneously moving up the first guide portion and the second guide portion in the process liquid supplying step to shift a process liquid guiding state from a state in which the process liquid scattered from the substrate rotated by the substrate holding mechanism is guided by the third guide portion to a state in which the process liquid is guided by the first guide portion; and simultaneously moving down the first guide portion, the second guide portion and the third guide portion in the process liquid supplying step to shift the process liquid guiding state from the state in which the process liquid scattered from the substrate rotated by the substrate holding mechanism is guided by the first guide portion to a state in which the process liquid flows over the first guide portion, the second guide portion and the third guide portion to be drained to the outside.

According to this method, when the process liquid guided by the second guide portion or the third guide portion is recovered, the recovered process liquid is prevented from being contaminated with the process liquid to be guided by the third guide portion without reduction of the process throughput. As a result, the purity of the recovered process liquid can be improved. Therefore, the process of the substrate can be properly performed even by reusing the recovered process liquid.

An inventive substrate processing apparatus for achieving the sixth object described above comprises a substrate holding mechanism which generally horizontally holds a substrate and rotates the substrate, a process liquid supplying mechanism for selectively supplying a first process liquid and a second process liquid to the substrate held by the substrate holding mechanism, a first guide portion provided around the substrate holding mechanism for guiding the first process liquid scattered from the substrate rotated by the substrate holding mechanism to cause the first process liquid to flow down, a second guide portion provided around the substrate holding mechanism for guiding the second process liquid scattered from the substrate rotated by the substrate holding mechanism to cause the second process liquid to flow down, a drain channel for draining the first process liquid guided by the first guide portion, a recovery channel for recovering the second process liquid guided by the second guide portion, and an evacuation mechanism for forcibly evacuating the drain channel. In this substrate processing apparatus, the drain channel and the recovery channel are atmospherically isolated from each other and the recovery channel is not forcibly evacuated.

With this arrangement, the drain channel is forcibly evacuated, so that the atmosphere around the substrate is sucked into the drain channel thereby to be removed when the first process liquid is drained into the drain channel. Further, the drain channel and the recovery channel are atmospherically isolated from each other, and the recovery channel is not forcibly evacuated. Even if the drain channel is evacuated, no air stream enters the recovery channel without the evacuation of the recovery channel. Therefore, droplets of the first process liquid are prevented from entering the recovery channel. This improves the purity of the process liquid recovered in the recovery channel while permitting the forced evacuation of the drain channel.

In this case, the first guide portion is preferably movable to a first position at which a relatively small gap is defined between the first guide portion and the substrate holding mechanism and to a second position at which a relatively large gap is defined between the first guide portion and the substrate holding mechanism and, when the second process liquid is guided by the second guide portion, the first guide portion is preferably located at the first position.

When the second process liquid is guided by the second guide portion, i.e., when the second process liquid is recovered in the recovery channel, the gap between the first guide portion and the substrate holding mechanism is thus narrowed. Therefore, even when the drain channel is evacuated, the second process liquid is prevented from being sucked into the drain channel from the gap between the first guide portion and the substrate holding mechanism by a suction force applied for the evacuation. Thus, the recovery rate of the second process liquid can be improved.

The first guide portion is preferably provided between the drain channel and the recovery channel integrally with the drain channel and the recovery channel.

In this case, a simple arrangement including the first guide portion provided between the drain channel and the recovery channel integrally with the drain channel and the recovery channel makes it possible to atmospherically isolate the drain channel and the recovery channel from each other and, hence, to prevent the evacuation of the recovery channel which may otherwise occur due to the evacuation of the drain channel. As a result, the purity of the process liquid recovered in the recovery channel can be improved without complication of the construction and an associated cost increase.

The inventive substrate processing apparatus for achieving the sixth object described above preferably further comprises an isolation member provided between the drain channel and the recovery channel and connected to the first guide portion, the isolation member being cooperative with the first guide portion to atmospherically isolate the drain channel and the recovery channel from each other.

Even when the first guide portion is provided separately from the drain channel and the recovery channel, a simple arrangement including the isolation member provided between the drain channel and the recovery channel and connected to the first guide portion makes it possible to atmospherically isolate the drain channel and the recovery channel from each other and, hence, to prevent the evacuation of the recovery channel which may otherwise occur due to the evacuation of the drain channel. As a result, the purity of the process liquid recovered in the recovery channel can be improved without complication of the construction and an associated cost increase.

The foregoing and other objects, features and effects of the present invention will become more apparent from the following detailed description of preferred embodiments with reference to the attached drawings.

DETAILED DESCRIPTION OF PREFERRED EMBODIMENTS

Figure 1:
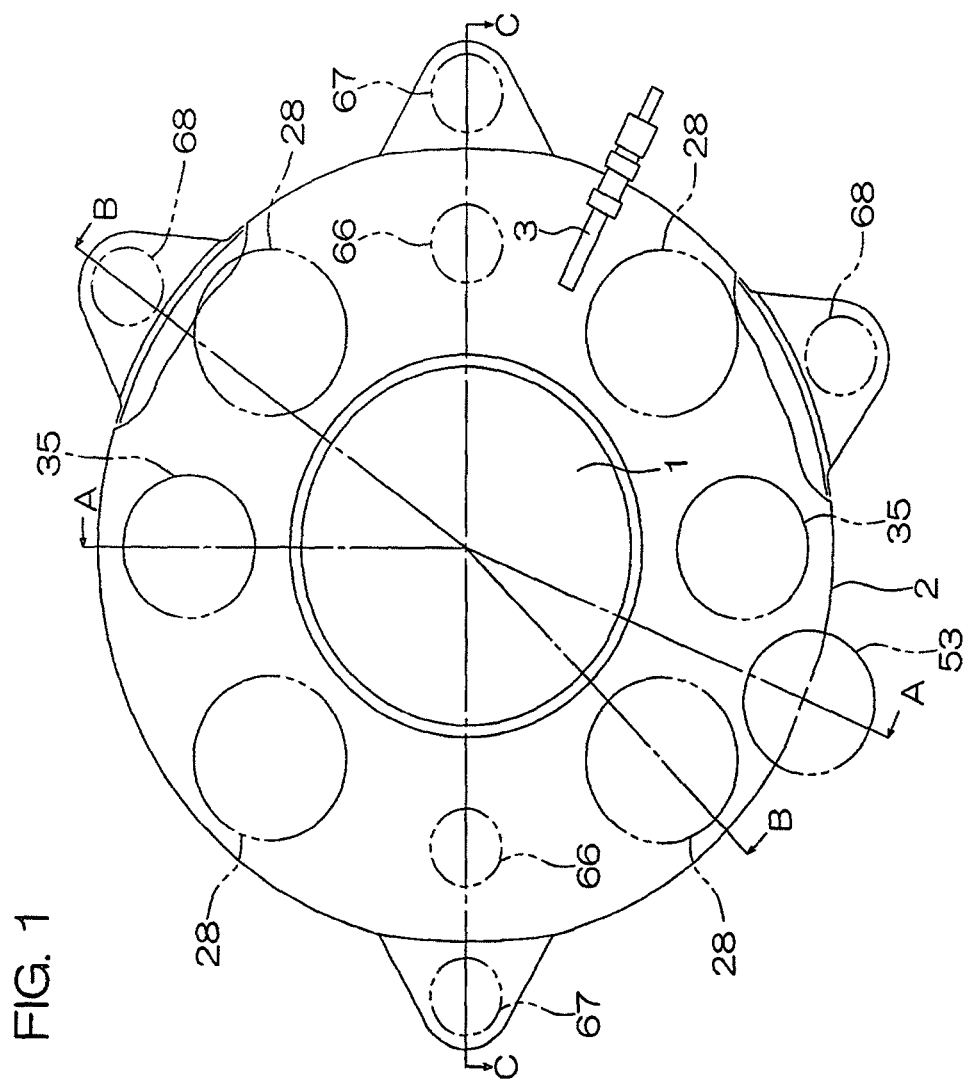
FIG. 1 is a plan view illustrating a construction of a substrate processing apparatus according to an embodiment of the present invention.

FIG. 1 is a plan view illustrating a construction of a substrate processing apparatus according to an embodiment of the present invention.

The substrate processing apparatus is adapted to perform a cleaning process on a wafer W (an example of a substrate) by supplying a first chemical, a second chemical and pure water (deionized water) as a process liquid in a predetermined order to the wafer W. The substrate processing apparatus includes a spin chuck 1 for generally horizontally holding the wafer W and rotating the wafer W about a generally vertical rotation axis C (see FIG. 2), a cup 2 in which the spin chuck 1 is accommodated, and a nozzle 3 for selectively supplying the first chemical, the second chemical and the pure water to a surface (upper surface) of the wafer W held by the spin chuck 1.

In FIG. 1, the nozzle 3 is disposed at a fixed position obliquely upward of the spin chuck 1 for supplying the process liquid to a surface of the wafer W from the obliquely upward position, but may be disposed at a fixed position on the rotation axis of the wafer W rotated by the spin chuck 1 for supplying the process liquid to the surface of the wafer W from the position vertically upward of the wafer W. Alternatively, a so-called scan nozzle system may be employed in which the nozzle 3 is attached to an arm pivotal within a horizontal plane above the spin chuck 1 (cup 2) and a process liquid supply position on the surface of the wafer W is scanned by pivoting the arm. Further, where a shield plate is disposed in closely opposed relation to the surface of the wafer W during a drying operation to be described later, a process liquid supply port may be provided in a center portion of the shield plate, so that the process liquid is supplied to the surface of the wafer W from the process liquid supply port. Further, a nozzle for supplying the first chemical, a nozzle for supplying the second chemical and a nozzle for supplying the pure water may be separately provided, which are selectively used for supplying the process liquid.

Figure 2:
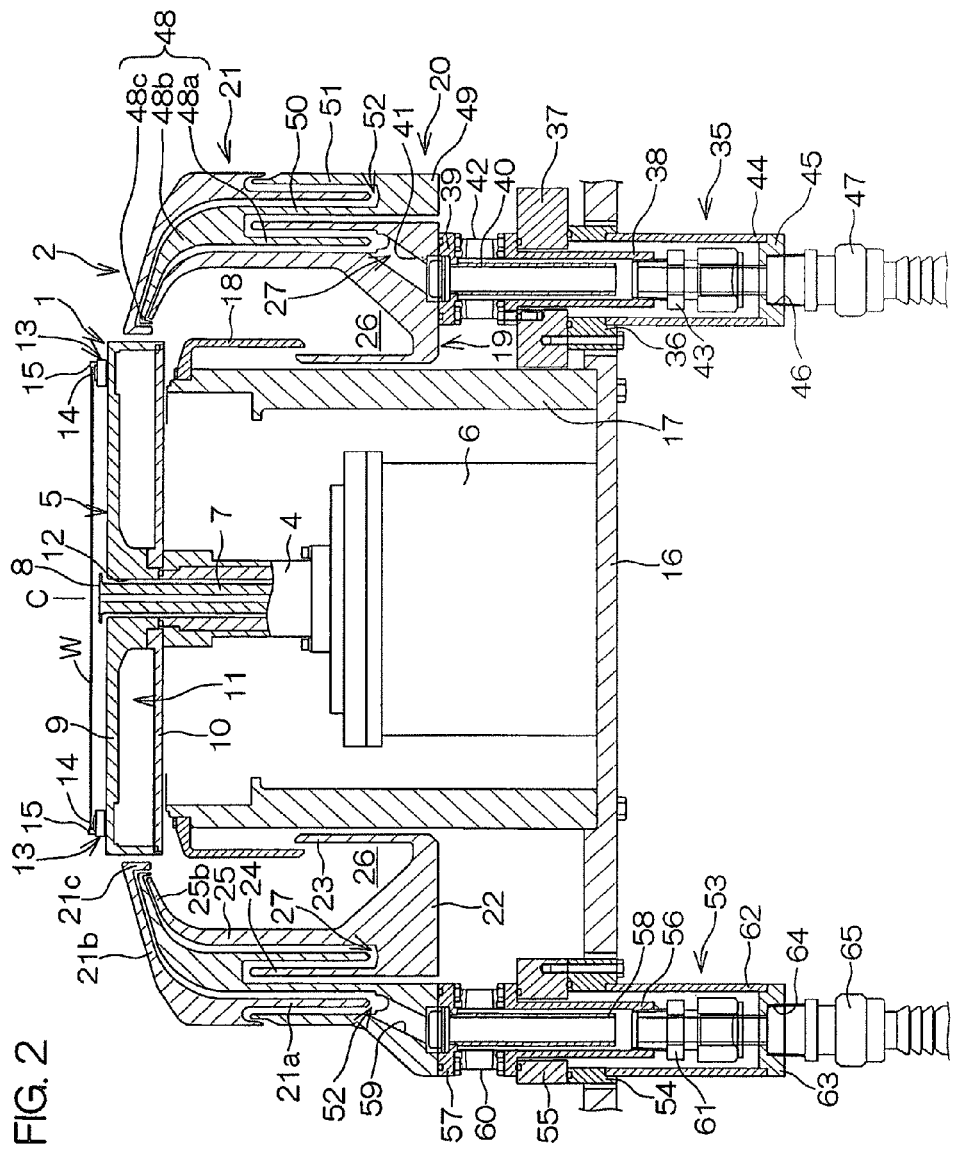
FIG. 2 is a sectional view of a spin chuck and a cup taken along a sectional line A-A in FIG. 1.
Figure 3:
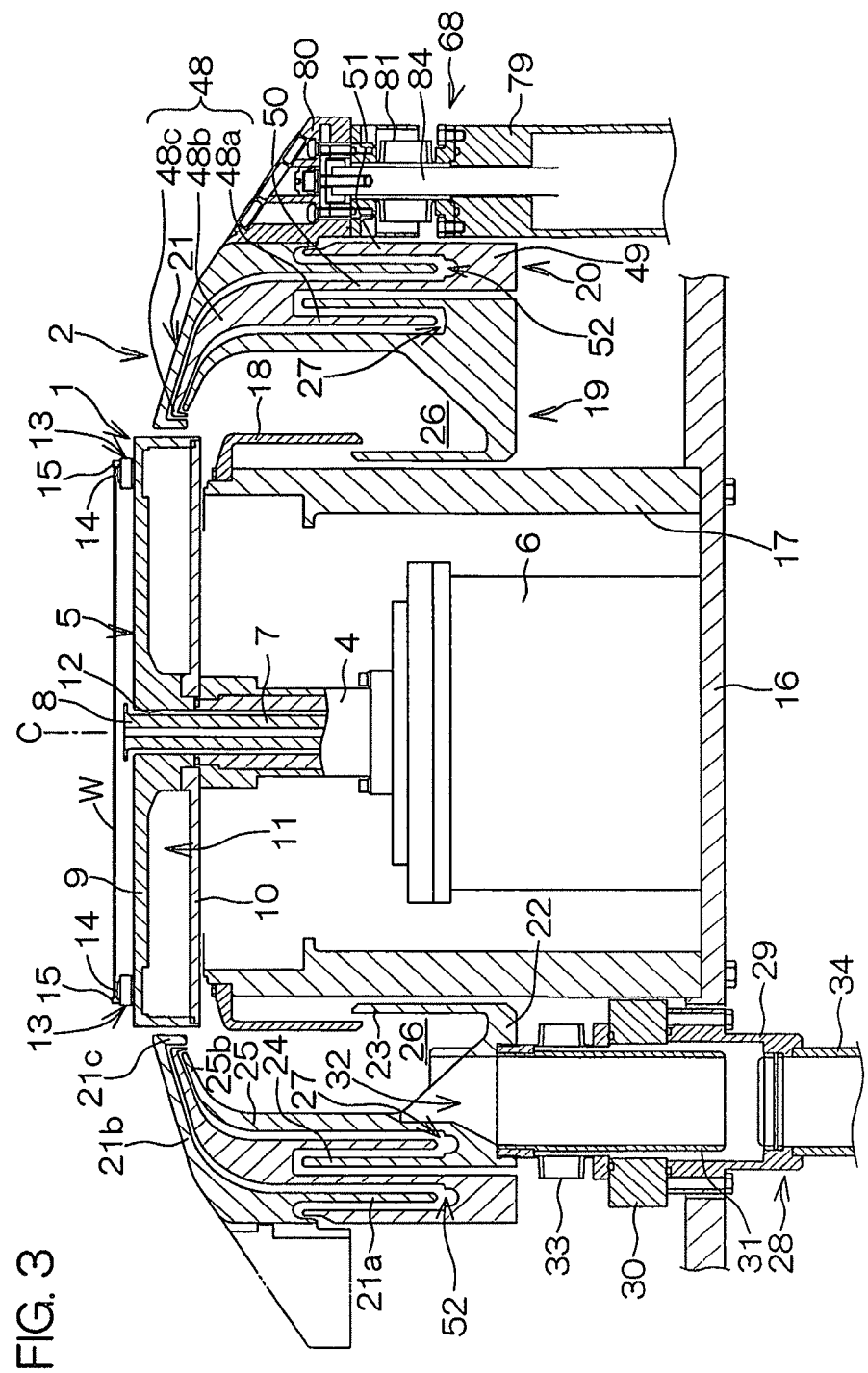
FIG. 3 is a sectional view of the spin chuck and the cup taken along a sectional line B-B in FIG. 1.
Figure 4:
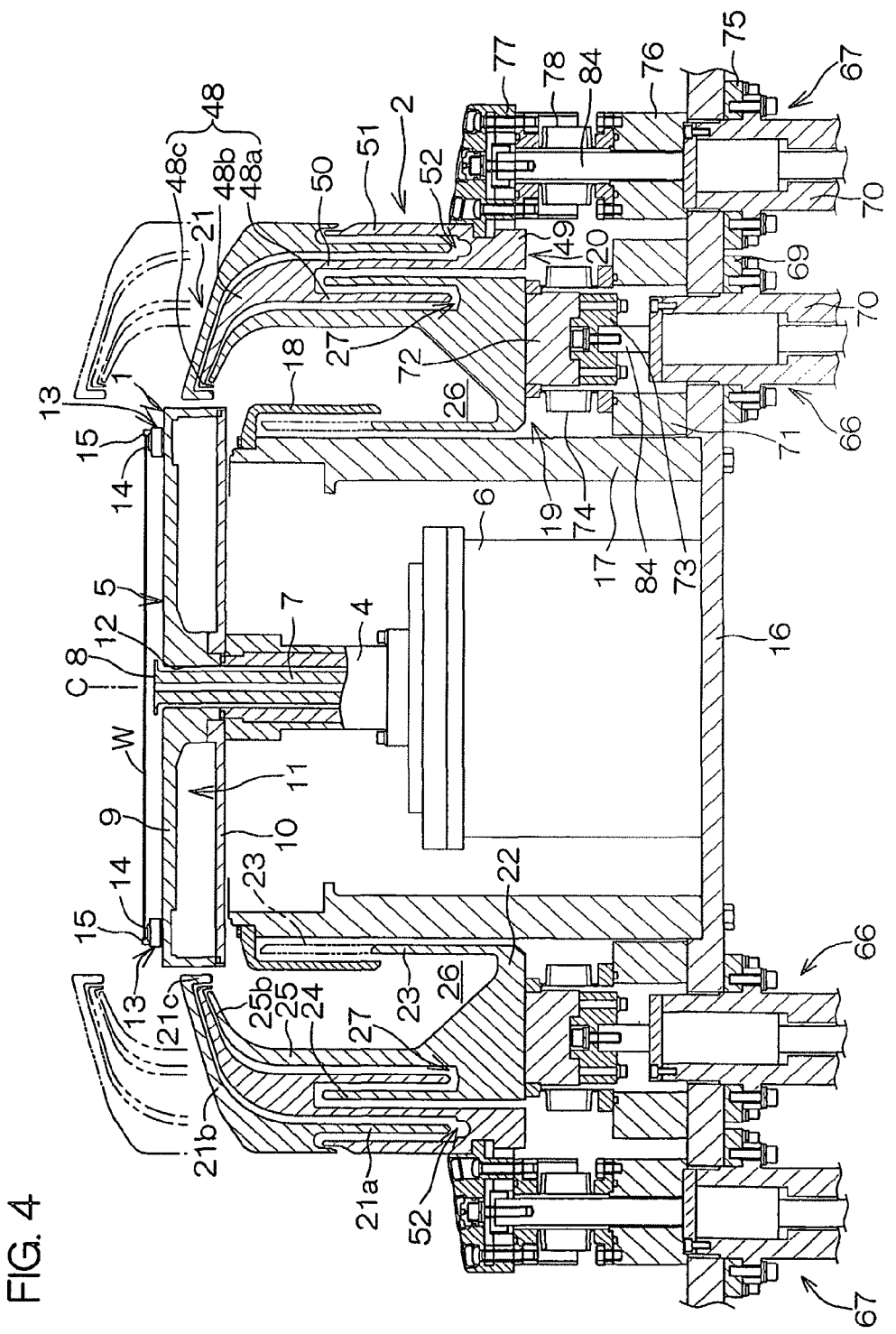
FIG. 4 is a sectional view of the spin chuck and the cup taken along a sectional line C-C in FIG. 1.

FIG. 2 is a sectional view of the spin chuck 1 and the cup 2 taken along a sectional line A-A in FIG. 1. FIG. 3 is a sectional view of the spin chuck 1 and the cup 2 taken along a sectional line B-B in FIG. 1. FIG. 4 is a sectional view of the spin chuck 1 and the cup 2 taken along a sectional line C-C in FIG. 1.

The spin chuck 1 includes a rotation shaft 4 disposed generally vertically, a disk-shaped spin base 5 fixed to an upper end of the rotation shaft 4, and a motor 6 disposed below the spin base 5.

The rotation shaft 4 is a hollow shaft integral with a driving shaft of the motor 6. A rear surface process liquid supply pipe 7 extends through the inside of the rotation shaft 4. The first chemical, the second chemical and the pure water are selectively supplied to the rear surface process liquid supply pipe 7. The rear surface process liquid supply pipe 7 has a rear surface nozzle 8 provided at an upper end thereof for spouting the process liquid (the first chemical, the second chemical or the pure water) selectively supplied to the rear surface process liquid supply pipe 7. The rear surface nozzle 8 spouts the process liquid generally vertically upward. The process liquid spouted from the rear surface nozzle 8 is generally vertically incident on a center portion of the rear surface of the wafer W held by the spin chuck 1.

The spin base 5 includes an upper cover 9 having a disk shape as seen in plan, and a lower cover 10 having also a disk shape as seen in plan. The upper cover 9 and the lower cover 10 are fixed to each other by bolts to define an accommodating space 11 therebetween for accommodating a link mechanism to be described later. The spin base 5 has a through-hole 12 provided in a center portion thereof (center portions of the upper cover 9 and the lower cover 10 thereof) as having substantially the same inner diameter as the rotation shaft 4. An upper end of the rotation shaft 4 is connected to the periphery of the through-hole 12, so that an interior surface of the rotation shaft 4 is continuous with a peripheral surface of the through-hole 12 with no step. A portion of the rear surface process liquid supply pipe 7 projects from the upper end of the rotation shaft 4, and the projecting portion of the rear surface process liquid pipe 7 is inserted in the through-hole 12.

A plurality of holder members 13 (three holder members 13 in this embodiment) are disposed generally equiangularly on a peripheral edge of an upper surface of the spin base 5. The holder members 13 each include a support portion 14 for supporting the wafer W from a lower side, and a restricting portion 15 for restricting a peripheral edge surface of the wafer W. The holder members 13 are coupled to each other by the link mechanism (not shown) accommodated in the spin base 5. The holder members 13 cooperatively hold the wafer W with the restricting portions 15 thereof in abutment against the peripheral edge of the wafer W supported by the support portions 14 thereof. The holder members 13 are disengaged from the wafer W with the restricting portions 15 thereof being retracted from the peripheral edge of the wafer W.

The motor 6 is disposed on a horizontally extending base 16, and surrounded by a tubular cover member 17. The cover member 17 has a lower edge fixed to the base 16, and an upper edge portion extending to the vicinity of the lower cover 10 of the spin base 5. A flange 18 is provided on the upper edge portion of the cover member 17 as generally horizontally projecting outward from the cover member 17 and bent downward.

The cup 2 includes an inner structural member 19, a middle structural member 20 and an outer structural member 21 which are vertically movable independently of each other.

The inner structural member 19 surrounds the spin chuck 1, and has a rotationally symmetrical shape about the rotation axis C of the wafer W to be rotated by the spin chuck 1. The inner structural member 19 integrally includes a bottom portion 22 having an annular plan shape, a hollow cylindrical inner wall 23 projecting upward from an inner peripheral edge of the bottom portion 22, a hollow cylindrical outer wall 24 projecting upward from an outer peripheral edge of the bottom portion 22, and a first guide portion 25 projecting upward from a portion thereof between the inner wall 23 and the outer wall 24 and having an upper edge portion 25b smoothly arcuately extending obliquely upward toward the center thereof (toward the rotation axis C of the wafer W).

The inner wall 23 has a length such as to be accommodated between the cover member 17 and the flange 18 in spaced relation from the cover member 17 and the flange 18 when the inner structural member 19 is located at the uppermost position (as indicated by a phantom line in FIG. 4).

The outer wall 24 has a length such as to be accommodated between a second guide portion 48 (lower edge portion 48a) and an inner wall 50 of the middle structural member 20 to be described later in spaced relation from the second guide portion 48 and the inner wall 50 when the inner structural member 19 and the middle structural member 20 are located in the closest relation.

A drain channel 26 is defined between the inner wall 23 and the first guide portion 25 for collecting and draining the process liquid used for the process of the wafer W. An inner recovery channel 27 is defined between the first guide portion 25 and the outer wall 24 for collecting and recovering the process liquid used for the process of the wafer W. In other words, the first guide portion 25 is disposed upright between the drain channel 26 and the inner recovery channel 27 to isolate the drain channel 26 and the inner recovery channel 27 from each other.

An evacuation mechanism 28 is connected to the drain channel 26 for draining the process liquid collected in the drain channel 26 and forcibly exhausting air from the drain channel 26. As shown in FIG. 1, the evacuation mechanism 28 includes, for example, four evacuation mechanisms 28 disposed equiangularly at an interval of 90 degrees. As shown in FIG. 3, the evacuation mechanisms 28 each include a stationary tubular member 29 extending through the base 16, an annular spacer 30 fixed to an upper end of the stationary tubular member 29, a movable tubular member 31 having an upper end connected to the bottom portion 22 of the inner structural member 19 and a lower end portion inserted in the spacer 30 and the stationary tubular member 29, a communication port 32 communicating the movable tubular member 31 to the drain channel 26, and a bellows 33 having an upper end fixed to the bottom portion 22 of the inner structural member 19 and a lower end fixed to the spacer 30 and covering an outer periphery of the movable tubular member 31.

A pipe 34 extending from a negative pressure source not shown is connected to a lower end of the stationary tubular member 29. When the stationary tubular member 29 is evacuated through the pipe 34 by a negative pressure generated by the negative pressure source, an atmosphere in the drain channel 26 is sucked into the stationary tubular member 29 through the movable tubular member 31. Thus, the evacuation of the drain channel 26 is achieved. Further, an atmosphere around the wafer W held by the spin chuck 1 is sucked into the drain channel 26 thereby to be removed by the evacuation of the drain channel 26. When the process liquid used for the process of the wafer W is collected in the drain channel 26, the process liquid collected in the drain channel 26 is discharged together with the atmosphere from the drain channel 26 through the communication port 32, the movable tubular member 31, the stationary tubular member 29 and the pipe 34. The process liquid discharged together with the atmosphere is separated from the atmosphere by a gas/liquid separator (not shown) disposed in the midst of the pipe 34, and drained, for example, into a drain line of a plant in which the substrate processing apparatus is installed.

A recovery mechanism 35 is connected to the inner recovery channel 27 for recovering the process liquid collected in the inner recovery channel 27 into a recovery tank not shown. As shown in FIG. 1, the recovery mechanism 35 includes, for example, recovery mechanisms 35 disposed in diametrically opposed relation with respect to the spin chuck 1 (symmetrically about the rotation axis C). As shown in FIG. 2, the recovery mechanisms 35 each include a hollow cylindrical insertion member 36 extending through the base 16, an annular spacer 37 fixed to an upper end of the insertion member 36, a stationary tubular member 38 having an upper end portion fixed to an upper surface of the spacer 37 and extending downward through the insertion member 36 and the spacer 37, a retainer member 39 fixed to the bottom portion 22 of the inner structural member 19, a movable tubular member 40 having an upper end portion retained by the retainer member 39 and a lower end portion inserted in the stationary tubular member 38, a communication port 41 communicating the inside of the movable tubular member 40 to the inner recovery channel 27, a bellows 42 having an upper end fixed to the retainer member 39 and a lower end fixed to the stationary tubular member 38 and covering an outer periphery of the movable tubular member 40, a joint 43 screwed into a lower end portion of the stationary tubular member 38, a tubular joint surrounding member 44 extending downward from a lower end portion of the insertion member 36 and surrounding the joint 43, and a cap member 45 closing a lower end opening of the joint surrounding member 44.

The cap member 45 has a connection port 46. A recovery pipe 47 extending from the recovery tank is connected to the joint 43 through the connection port 46. The process liquid collected in the inner recovery channel 27 is recovered in the recovery tank through the communication port 41, the movable tubular member 40, the stationary tubular member 38, the joint 43 and the recovery pipe 47.

The middle structural member 20 surrounds the spin chuck 1, and has a generally rotationally symmetrical shape about the rotation axis C of the wafer W to be rotated by the spin chuck 1. The middle structural member 20 integrally includes a second guide portion 48, a bottom portion 49 having an annular plan shape, a hollow cylindrical inner wall 50 projecting upward from an inner peripheral edge of the bottom portion 49 and connected to the second guide portion 48, and a hollow cylindrical outer wall 51 projecting upward from an outer peripheral edge of the bottom portion 49.

The second guide member 48 disposes outside the first guide portion 25 of the inner structural member 19 and includes a lower edge portion 48a having a hollow cylindrical shape concentric with a lower portion of the first guide member 25, an upper edge portion 48b smoothly arcuately extending obliquely upward from an upper edge of the lower edge portion 48a toward the center thereof (toward the rotation axis C of the wafer W), and a folded portion 48c formed by folding a distal edge portion of the upper edge portion 48b downward.

The lower edge portion 48a is located above the inner recovery channel 27. The lower edge portion 48a is accommodated in the inner recovery channel 27 in spaced relation with respect to the bottom portion 22 and the outer wall 24 and the first guide portion 25 of the inner structural member 19 when the middle structural member 20 and the inner structural member 19 are located in the closest relation.

The upper edge portion 48b vertically overlaps with the upper edge portion 25b of the first guide portion 25 of the inner structural member 19. When the middle structural member 20 and the inner structural member 19 are located in the closest relation, the upper edge portion 48b is located close to the upper edge portion 25b of the first guide portion 25 with a very small gap being defined between the upper edge portion 48b and the upper edge portion 25b.

The folded portion 48c horizontally overlaps with the upper edge portion 25b of the first guide portion 25 when the middle structural member 20 and the inner structural member 19 are located in the closest relation.

Further, the upper edge portion 48b of the second guide portion 48 has a thickness which is progressively increased toward a lower side, and the inner wall 50 is connected to an outer peripheral edge of the upper edge portion 48b. The bottom portion 49, the inner wall 50 and the outer wall 51 cooperatively define an outer recovery channel 52 having a generally U-shaped cross section for collecting and recovering the process liquid used for the process of the wafer W.

The outer recovery channel 52 is connected to a recovery mechanism 53 for recovering the process liquid collected in the outer recovery channel 52 into a recovery tank not shown. As shown in FIG. 2, the recovery mechanism 53 includes a hollow cylindrical insertion member 54 extending through the base 16, an annular spacer 55 fixed to an upper end of the insertion member 54, a stationary tubular member 56 having an upper end portion fixed to an upper surface of the spacer 55 and extending downward through the insertion member 54 and the spacer 55, a retainer member 57 fixed to the bottom portion 49 of the middle structural member 20, a movable tubular member 58 having an upper end portion retained by the retainer member 57 and a lower end portion inserted in the stationary tubular member 56, a communication port 59 communicating the inside of the movable tubular member 58 to the outer recovery channel 52, a bellows 60 having an upper end fixed to the retainer member 57 and a lower end fixed to the stationary tubular member 56 and covering an outer periphery of the movable tubular member 58, a joint 61 screwed into a lower end portion of the stationary tubular member 56, a tubular joint surrounding member 62 extending downward from a lower end portion of the insertion member 54 and surrounding the joint 61, and a cap member 63 closing a lower end opening of the joint surrounding member 62.

The cap member 63 has a connection port 64. A recovery pipe 65 extending from the recovery tank is connected to the joint 61 through the connection port 64. The process liquid collected in the outer recovery channel 52 is recovered in the recovery tank through the communication port 59, the movable tubular member 58, the stationary tubular member 56, the joint 61 and the recovery pipe 65.

The outer structural member 21 is provided around the spin chuck 1 outside the second guide portion 48 of the middle structural member 20, and has a generally rotationally symmetrical shape about the rotation axis C of the wafer W to be rotated by the spin chuck 1. The outer structural member 21 includes a lower edge portion 21a having a hollow cylindrical shape concentric with the lower edge portion 48a of the second guide member 48, an upper edge portion 21b smoothly arcuately extending obliquely upward from an upper edge of the lower edge portion 21a toward the center thereof (toward the rotation axis C of the wafer W), and a folded portion 21c formed by folding a distal edge portion of the upper edge portion 21b downward.

The lower edge portion 21a is located above the outer recovery channel 52, and has a length such as to be accommodated in the outer recovery channel 52 in spaced relation with respect to the bottom portion 49 and the inner wall 50 and the outer wall 51 of the middle structural member 20 when the outer structural member 21 and the middle structural member 20 are located in the closest relation.

The upper edge portion 21b vertically overlaps with the upper edge portion 48b of the second guide portion 48 of the middle structural member 20. When the outer structural member 21 and the middle structural member 20 are located in the closest relation, the upper edge portion 21b is located close to the upper edge portion 48b of the second guide portion 48 with a very small gap being defined between the upper edge portion 21b and the upper edge portion 48b.

The folded portion 21c horizontally overlaps with the upper edge portion 48b of the second guide portion 48 when the outer structural member 21 and the middle structural member 20 are located in the closest relation.

The cup 2 includes a first lift mechanism 66 for moving up and down the inner structural member 19, a second lift mechanism 67 for moving up and down the middle structural member 20, and a third lift mechanism 68 for moving up and down the outer structural member 21.

As shown in FIG. 1, the first lift mechanism 66 includes, for example, first lift mechanisms 66 disposed in diametrically opposed relation with respect to the spin chuck 1 (symmetrically about the rotation axis C). As shown in FIG. 4, the first lift mechanisms 66 each include an annular fixing member 69 fixed to a lower surface of the base 16, a ball screw mechanism 70 fixed to the fixing member 69 as extending through the base 16, an annular spacer 71 fixed to an upper surface of the base 16, a block 72 fixed to the bottom portion 22 of the inner structural member 19, a coupling member 73 which couples a shaft 84 of the ball screw mechanism 70 to be described later to the block 72, and a bellows 74 having an upper end portion fixed to the bottom portion 22 of the inner structural member 19 and a lower end portion fixed to the spacer 71 and covering outer peripheries of the block 72, the coupling member 73 and the shaft 84 of the ball screw mechanism 70.

As shown in FIG. 1, the second lift mechanism 67 includes, for example, second lift mechanisms 67 disposed in diametrically opposed relation with respect to the spin chuck 1 (symmetrically about the rotation axis C). As shown in FIG. 4, the second lift mechanisms 67 each include an annular fixing member 75 fixed to the lower surface of the base 16, a ball screw mechanism 70 fixed to the fixing member 75 as extending through the base 16, an annular spacer 76 fixed to the upper surface of the base 16, a coupling block 77 fixed to a side surface of the middle structural member 20 and coupled to a shaft 84 of the ball screw mechanism 70 to be described later, and a bellows 78 having an upper end portion fixed to the coupling block 77 and a lower end portion fixed to the spacer 76 and covering an outer periphery of the shaft 84 of the ball screw mechanism 70.

As shown in FIG. 1, the third lift mechanism 68 includes, for example, two third lift mechanisms 68 spaced a center angle of 120 degrees about the rotation axis C of the wafer W (see FIG. 2). As shown in FIG. 3, the third lift mechanisms 68 each include a hollow cylindrical spacer 79 fixed to the upper surface of the base 16, a coupling block 80 fixed to a side surface of the outer structural member 21 and coupled to a shaft 84 of a ball screw mechanism 70 to be described later, and a bellows 81 having an upper end portion fixed to the coupling block 80 and a lower end portion fixed to the spacer 79 and covering an outer periphery of the shaft 84 of the ball screw mechanism 70. In each of the third lift mechanisms 68, the ball screw mechanism 70 is fixed to a fixing member (not shown) fixed to the lower surface of the base 16 as extending through the base 16 as in the first lift mechanisms 66 and the second lift mechanisms 67.

Figure 5:
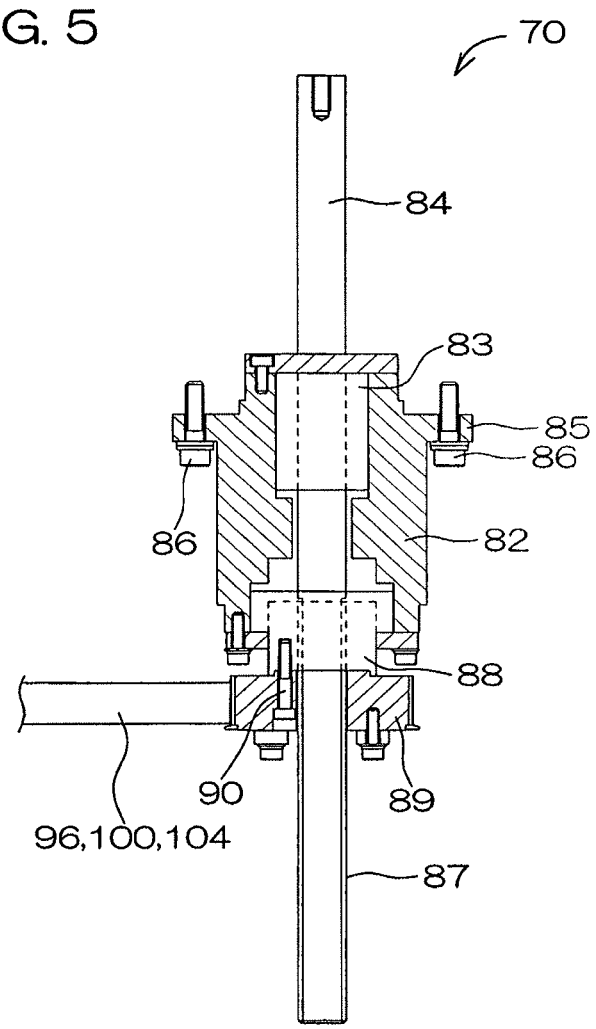
FIG. 5 is a sectional view of a ball screw mechanism.

FIG. 5 is a sectional view illustrating a construction of the ball screw mechanism 70.

The ball screw mechanisms 70 each include a retainer tube 82, a ball spline bearing 83 engaged with an upper end portion of the retainer tube 82, and the shaft 84 which is retained by the ball spline bearing 83 in a longitudinally movable manner.

The retainer tube 82 has a flange 85 provided around the upper end portion thereof as projecting outward from an outer peripheral surface thereof. Bolts 86 extending through the flange 85 are screwed into the fixing member 69, 75 (see FIG. 4), whereby the retainer tube 82 is fixed to the fixing member 69, 75.

The shaft 84 has a thread groove 87 provided on an outer peripheral surface of a lower half portion thereof. A nut 88 is threadingly engaged with the thread groove 87. The shaft 84 extends in a rotatable manner through a pulley 89 to which a torque of a motor 91, 92, 93 to be described later is inputted. The pulley 89 is fixed to the nut 88 by bolts 90 so as not to rotate relative to the nut 88. Accordingly, when the torque is inputted to the pulley 89, the nut 88 is rotated together with the pulley 89, and the rotation of the nut 88 is converted to a linear motion of the shaft 84 by the thread groove 87. Thus, the shaft 84 is vertically linearly moved.

Figure 6:
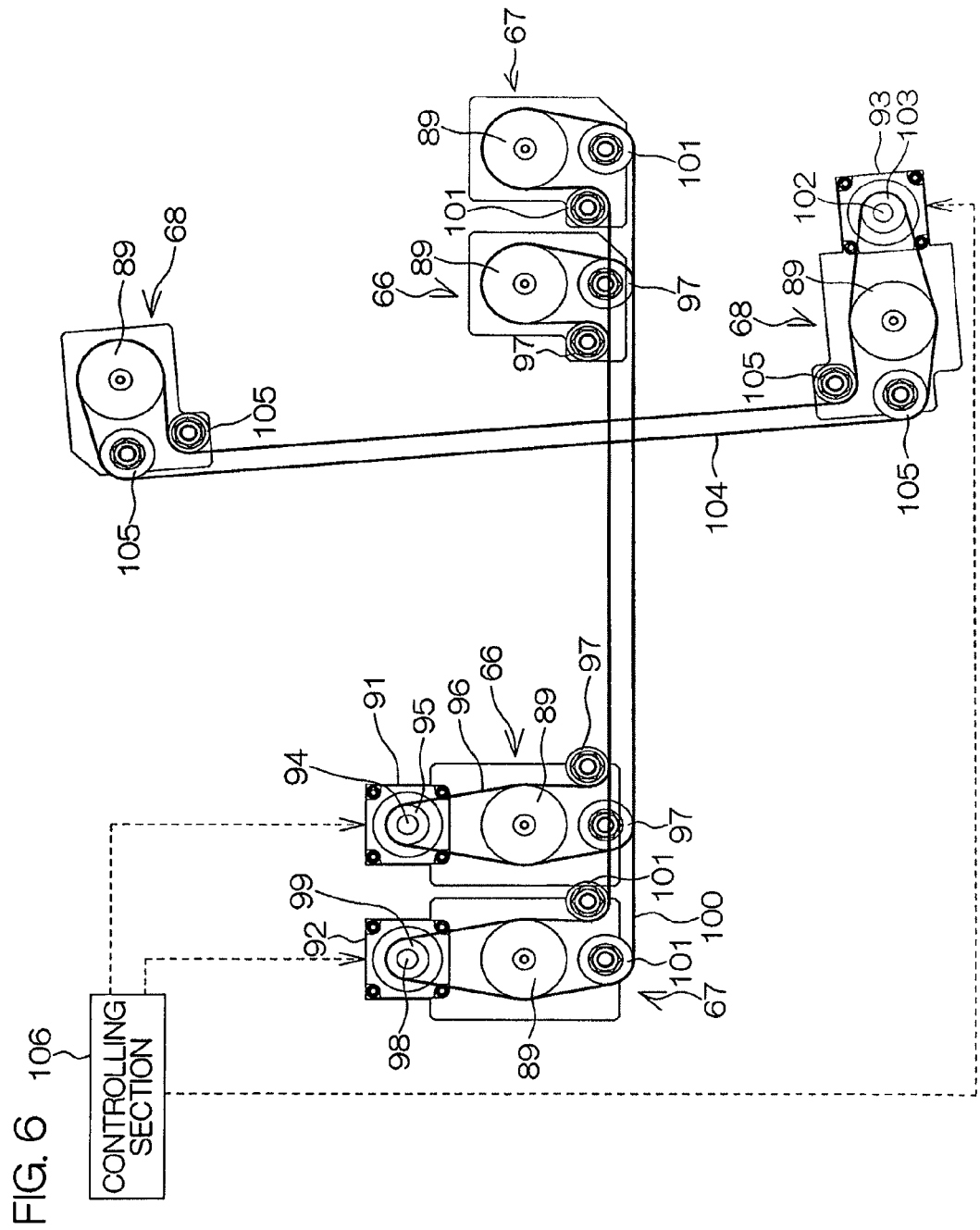
FIG. 6 is a simplified plan view illustrating an arrangement for transmitting driving forces to a first lift mechanism, a second lift mechanism and a third lift mechanism.

FIG. 6 is a simplified plan view illustrating an arrangement for transmitting driving forces to the first lift mechanisms 66, the second lift mechanisms 67 and the third lift mechanisms 68.

In the substrate processing apparatus, the motors 91, 92, 93 are respectively provided for the two first lift mechanisms 66, for the two second lift mechanisms 67 and for the two third lift mechanisms 68.

The motor 91 is disposed in the vicinity of one of the two first lift mechanisms 66. A motor pulley 95 is fixed to an output shaft 94 of the motor 91. An endless belt 96 is entrained around the motor pulley 95. The belt 96 is also entrained around the pulley 89 of the ball screw mechanism 70 provided in the other first lift mechanism 66 (disposed apart from the motor 91). The pulley 89 of the ball screw mechanism 70 of the one first lift mechanism 66 provided in the vicinity of the motor pulley 95 is held by the belt 96 from opposite sides thereof. Further, two tension pulleys 97 are provided in association with each of the first lift mechanisms 66. These tension pulleys 97 apply a tensile force to the belt 96 so as to prevent the belt 96 from slipping on the pulleys 89 and the motor pulley 95.

The motor 92 is disposed in the vicinity of one of the two second lift mechanisms 67. A motor pulley 99 is fixed to an output shaft 98 of the motor 92. An endless belt 100 is entrained around the motor pulley 99. The belt 100 is also entrained around the pulley 89 of the ball screw mechanism 70 provided in the other second lift mechanism 67 (disposed apart from the motor 92). The pulley 89 of the ball screw mechanism 70 of the one second lift mechanism 67 provided in the vicinity of the motor pulley 99 is held by the belt 100 from opposite sides thereof. Further, two tension pulleys 101 are provided in association with each of the second lift mechanisms 67. These tension pulleys 101 apply a tensile force to the belt 100 so as to prevent the belt 100 from slipping on the pulleys 89 and the motor pulley 99.

The motor 93 is disposed in the vicinity of one of the two third lift mechanisms 68. A motor pulley 103 is fixed to an output shaft 102 of the motor 93. An endless belt 104 is entrained around the motor pulley 103. The belt 104 is also entrained around the pulley 89 of the ball screw mechanism 70 provided in the other third lift mechanism 68 (disposed apart from the motor 93). The pulley 89 of the ball screw mechanism 70 of the one third lift mechanism 68 provided in the vicinity of the motor pulley 103 is held by the belt 104 from opposite sides thereof. Further, two tension pulleys 105 are provided in association with each of the third lift mechanisms 68. These tension pulleys 105 apply a tensile force to the belt 104 so as to prevent the belt 104 from slipping on the pulleys 89 and the motor pulley 103.

Thus, torques generated by the motors 91, 92, 93 are respectively inputted to the first lift mechanisms 66, the second lift mechanisms 67 and the third lift mechanisms 68 by individually driving the motors 91, 92, 93. Thus, the inner structural member 19, the middle structural member 20 and the outer structural member 21 are independently moved up and down by the first lift mechanisms 66, the second lift mechanisms 67 and the third lift mechanisms 68.

The substrate processing apparatus further has a controlling section 106 including a microprocessor. The controlling section 106 controls the motors 91, 92, 93 so as to locate the inner structural member 19, the middle structural member 20 and the outer structural member 21 at proper positions in individual steps of the process of the wafer W.

FIGS. 7 to 10 are schematic sectional views for explaining the positions of the inner structural member 19, the middle structural member 20 and the outer structural member 21 in the individual steps of the process of the wafer W.

During the process of the wafer W, the drain channel 26 is constantly evacuated by the evacuation mechanism 28.

Figure 7:
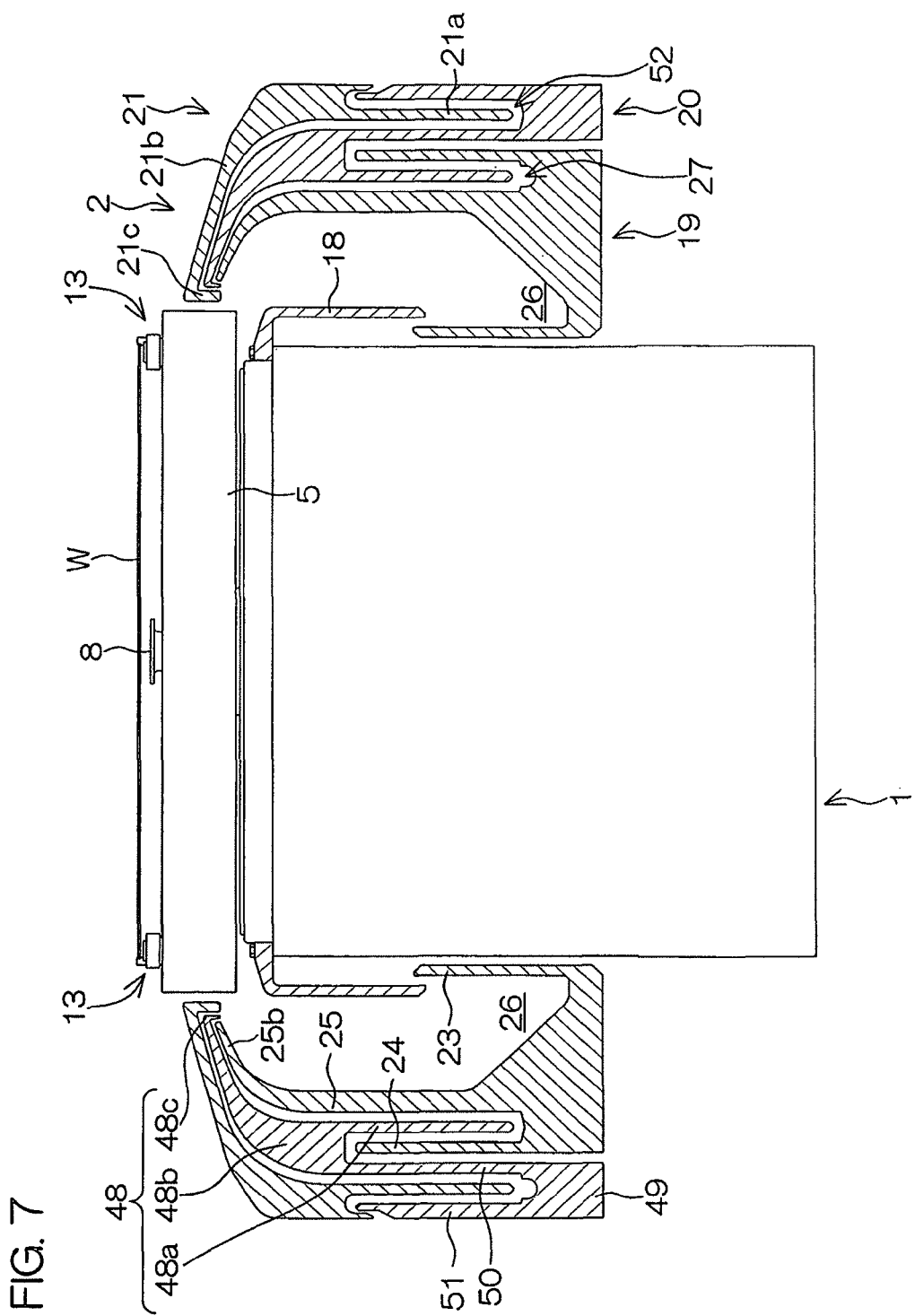
FIG. 7 is a schematic sectional view for explaining positions of an inner structural member, a middle structural member and an outer structural member during a wafer loading operation and a wafer drying operation.

Before the loading of the wafer W, the inner structural member 19, the middle structural member 20 and the outer structural member 21 are located at the lowermost position as shown in FIG. 7. At this time, the upper edge portion 25*b* of the first guide portion 25 of the inner structural member 19, the upper edge portion 48*b* of the second guide portion 48 of the middle structural member 20 and the upper edge portion 21*b* of the outer structural member 21 are located at a lower level than a wafer holding position at which the wafer W is held by the spin chuck 1.

Figure 8:
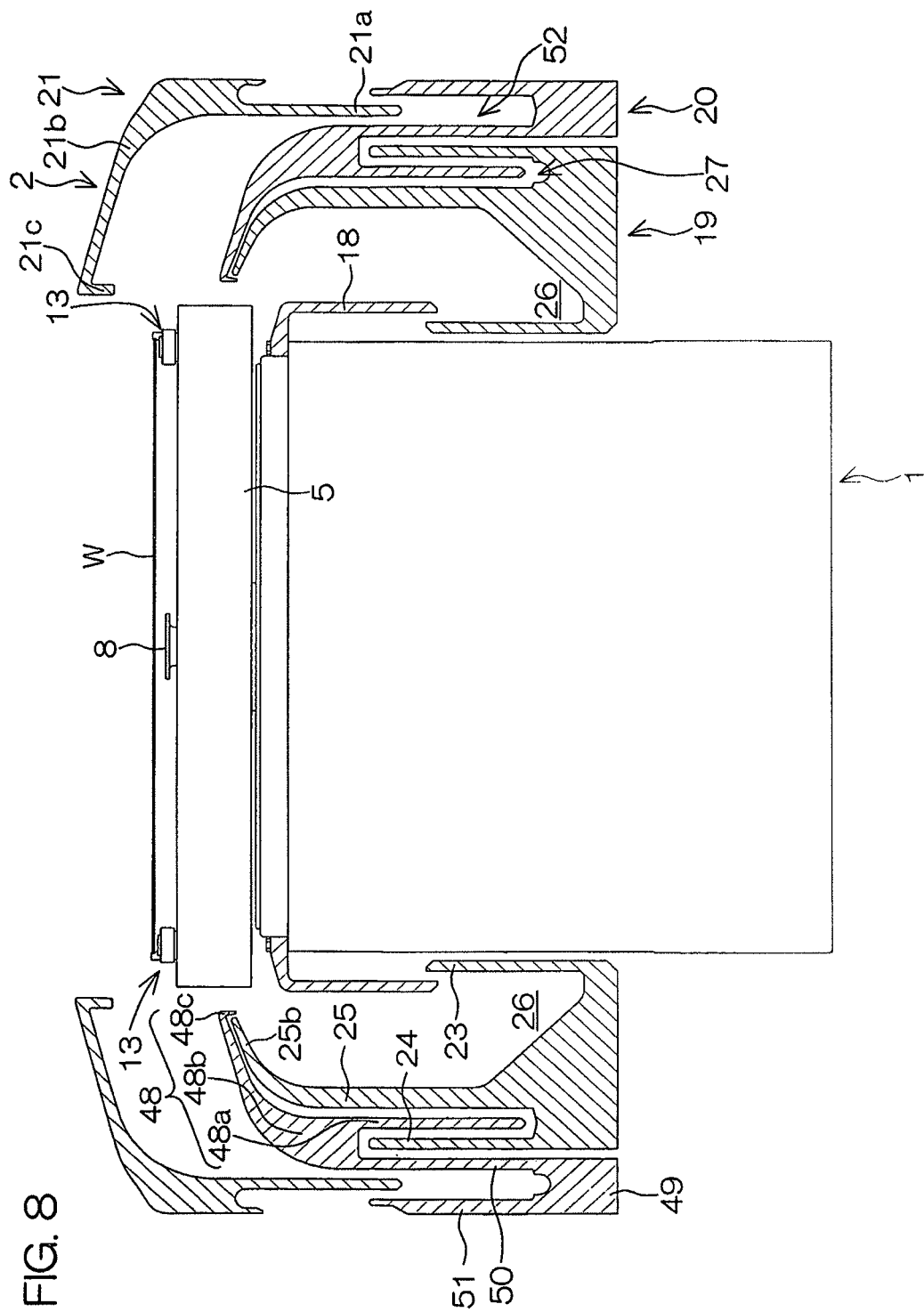
FIG. 8 is a schematic sectional view for explaining positions of the inner structural member, the middle structural member and the outer structural member during a wafer process with a first chemical.

When the wafer W is loaded to be held by the spin chuck 1, only the outer structural member 21 is moved up, whereby the upper edge portion 21*b* of the outer structural member 21 is located at a higher level than the wafer W held by the spin chuck 1 as shown in FIG. 8. Thus, an opening is defined between the upper edge portion 48*b* of the second guide member 48 of the middle structural member 20 and the upper edge portion 21*b* of the outer structural member 21 in opposed relation to the peripheral edge surface of the wafer W.

Thereafter, the wafer W (spin chuck 1) is rotated, and the first chemical is supplied to the front and rear surfaces of the rotating wafer W from the nozzle 3 and the rear surface nozzle 8, respectively. The first chemical supplied to the front and rear surfaces of the wafer W receives a centrifugal force generated by the rotation of the wafer W to flow over the front and rear surfaces of the wafer W, and is scattered radially outward from the peripheral edge of the wafer W. Thus, the first chemical is spread over the front and rear surfaces of the wafer W, whereby the process of the front and rear surfaces of the wafer W with the first chemical is achieved.

The first chemical spun out to be scattered radially outward from the peripheral edge of the wafer W enters the opening between the upper edge portion 48*b* of the second guide portion 48 of the middle structural member 20 and the upper edge portion 21*b* of the outer structural member 21. Then, the first chemical flows down along an inner surface of the outer structural member 21 to be collected in the outer recovery channel 52 and recovered from the outer recovery channel 52 into the recovery tank through the recovery mechanism 53. At this time, the inner structural member 19 and the middle structural member 20 are located in close relation with the very small gap being defined between the upper edge portion 25*b* of the first guide portion 25 of the inner structural member 19 and the upper edge portion 48*b* of the second guide portion 48 of the middle structural member 20, and the folded portion 48*c* of the second guide portion 48 horizontally overlaps with the upper edge portion 25*b* of the first guide portion 25, whereby the process liquid is prevented from intruding into a space between the first guide portion 25 and the second guide portion 48.

Figure 9:
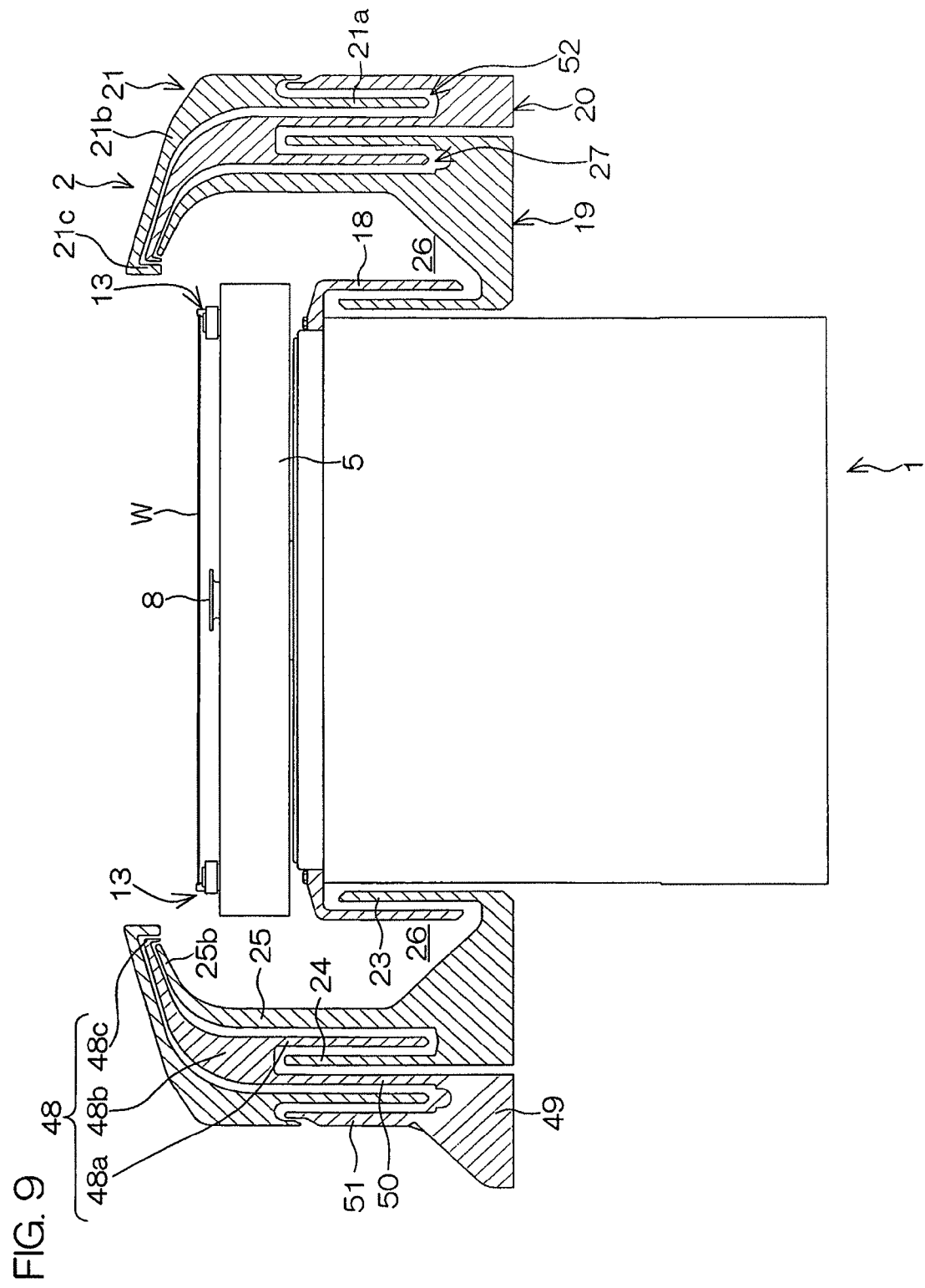
FIG. 9 is a schematic sectional view for explaining positions of the inner structural member, the middle structural member and the outer structural member during a rinsing operation.

After the first chemical is supplied to the wafer W for a predetermined period, the inner structural member 19 and the middle structural member 20 are moved up, so that the upper edge portion 25*b* of the first guide portion 25 of the inner structural member 19, the upper edge portion 48*b* of the second guide portion 48 of the middle structural member 20 and the upper edge portion 21*b* of the outer structural member 21 are located at a higher level than the wafer W held by the spin chuck 1 as shown in FIG. 9. At this time, the inner structural member 19 and the middle structural member 20 are moved up in synchronization with the very small gap being defined between the upper edge portion 25*b* of the first guide portion 25 of the inner structural member 19 and the upper edge portion 48*b* of the second guide portion 48 of the middle structural member 20 (while being kept in a predetermined positional relation). Thus, the process liquid scattered from the wafer W is prevented from intruding into the space between the first guide portion 25 and the second guide portion 48 even when the rotation of the wafer W by the spin chuck 1 and the supply of the first chemical are continued.

Thereafter, the supply of the first chemical from the nozzle 3 and the rear surface nozzle 8 is stopped. Then, the pure water is supplied to the front and rear surfaces of the wafer W from the nozzle 3 and the rear surface nozzle 8, respectively. Thus, the rinsing operation is performed to rinse the front and rear surfaces of the wafer W with the pure water. The pure water supplied to the front and rear surfaces of the wafer W receives a centrifugal force generated by the rotation of the wafer W to flow over the front and rear surfaces of the wafer W. At this time, the first chemical adhering to the front and rear surfaces of the wafer W is rinsed away. Then, the pure water containing the first chemical is spun out from the peripheral edge of the wafer W to be scattered.

The pure water (containing the first chemical) spun out to be scattered radially outward from the peripheral edge of the wafer W is captured by an inner surface of the first guide portion 25 of the inner structural member 19. Then, the pure water flows down along the inner surface of the inner structural member 19 to be collected in the drain channel 26, and is discharged together with the atmosphere of the drain channel 26 by the evacuation mechanism 28. At this time, the inner structural member 19, the middle structural member 20 and the outer structural member 21 are located in close relation with the very small gaps being defined between the upper edge portions of the inner structural member 19 and the middle structural member 20 and between the upper edge portions of the middle structural member 20 and the outer structural member 21. Further, the folded portion 21c of the outer structural member 21 horizontally overlaps with the upper edge portion 48b of the second guide portion 48, and the folded portion 48c of the second guide portion 48 horizontally overlaps with the upper edge portion 25b of the first guide portion 25. Thus, the process liquid is prevented from intruding into the space between the first guide portion 25 and the second guide portion 48 and a space between the second guide portion 48 and the outer structural member 21.

Figure 10:
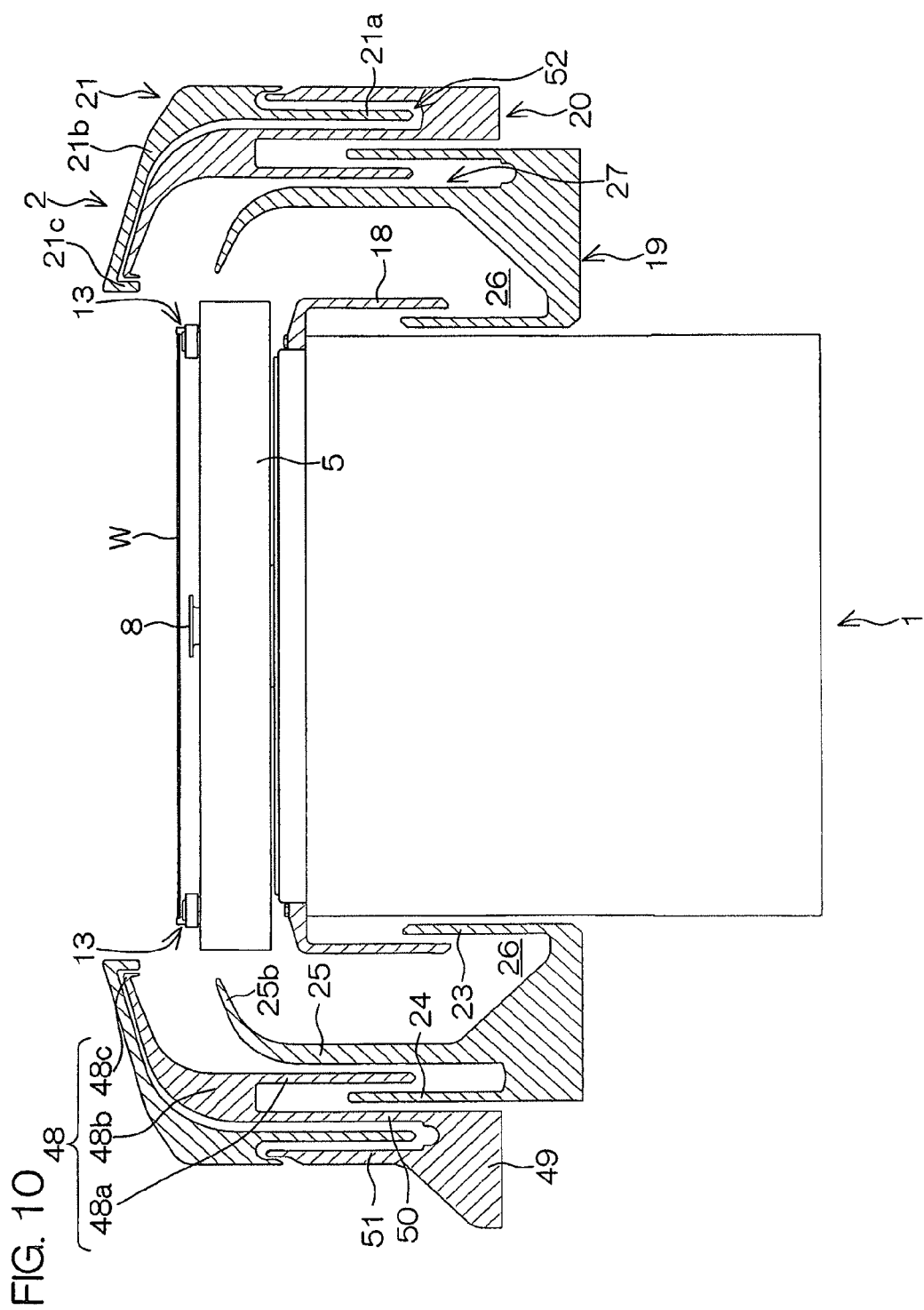
FIG. 10 is a schematic sectional view for explaining positions of the inner structural member, the middle structural member and the outer structural member during a wafer process with a second chemical.

After the pure water is supplied to the wafer W for a predetermined period, the supply of the pure water from the nozzle 3 and the rear surface nozzle 8 is stopped. Then, the inner structural member 19, the middle structural member 20 and the outer structural member 21 are moved down to the lowermost position, whereby the upper edge portion 25b of the first guide portion 25 of the inner structural member 19, the upper edge portion 48b of the second guide portion 48 of the middle structural member 20 and the upper edge portion 21b of the outer structural member 21 are located at a lower level than the wafer W. Thereafter, the rotation speed of the wafer W (spin chuck 1) is increased to a predetermined high rotation speed to perform a drying operation for a predetermined period to dry the wafer W by spinning out the rinse liquid adhering to the surfaces of the rinsed wafer W by a centrifugal force. After the completion of the drying operation, the rotation of the wafer W by the spin chuck 1 is stopped, and the processed wafer W is unloaded from the spin chuck 1.

Where the wafer W is to be processed with the second chemical immediately after the rinsing operation following the process with the first chemical, the supply of the pure water from the nozzle 3 and the rear surface nozzle 8 is stopped. Thereafter, the inner structural member 19 is moved down from the state in which the inner structural member 19, the middle structural member 20 and the outer structural member 21 are located at the uppermost position, so that only the upper edge portion 25b of the first guide portion 25 of the inner structural member 19 is located at a lower level than the wafer W held by the spin chuck 1 as shown in FIG. 10. Thus, an opening is defined between the upper edge portion of the inner structural member 19 and the upper edge portion 48b of the second guide portion 48 of the middle structural member 20 in opposed relation to the peripheral edge surface of the wafer W.

Then, the second chemical is supplied to the front and rear surfaces of the wafer W rotated continuously from the rinsing operation from the nozzle 3 and the rear surface nozzle 8, respectively. The second chemical supplied to the front and rear surfaces of the wafer W receives a centrifugal force generated by the rotation of the wafer W to flow over the front and rear surfaces of the wafer W, and is scattered radially outward from the peripheral edge of the wafer W. Thus, the second chemical is spread over the front and rear surfaces of the wafer W, whereby the process of the front and rear surfaces of the wafer W with the second chemical is achieved.

The second chemical spun out to be scattered radially outward from the peripheral edge of the wafer W enters the opening between the upper edge portion 25b of the first guide portion 25 of the inner structural member 19 and the upper edge portion 48b of the second guide portion 48 of the middle structural member 20. Then, the second chemical flows down along an inner surface of the second guide portion 48 to be collected in the inner recovery channel 27 and recovered from the inner recovery channel 27 into the recovery tank through the recovery mechanisms 35. At this time, the middle structural member 20 and the outer structural member 21 are located in close relation with the very small gap being defined between the upper edge portion 48b of the second guide portion 48 of the middle structural member 20 and the upper edge portion 21b of the outer structural member 21, and the folded portion 21c of the outer structural member 21 horizontally overlaps with the upper edge portion 48b of the second guide portion 48, whereby the process liquid is prevented from intruding into the space between the second guide portion 48 and the outer structural member 21.

After the second chemical is supplied to the wafer W for a predetermined period, the inner structural member 19 is moved up, so that the upper edge portion 25b of the first guide portion 25 of the inner structural member 19, the upper edge portion 48b of the second guide portion 48 of the middle structural member 20 and the upper edge portion 21b of the outer structural member 21 are located at a higher level than the wafer W held by the spin chuck 1 as shown in FIG. 9.

Thereafter, the supply of the second chemical from the nozzle 3 and the rear surface nozzle 8 is stopped. Then, the pure water is supplied to the front and rear surfaces of the wafer W from the nozzle 3 and the rear surface nozzle 8, respectively, whereby the rinsing operation is performed to wash away the second chemical adhering to the front and rear surfaces of the wafer W. In this rinsing operation, the pure water (containing the second chemical) spun out to be scattered radially outward from the peripheral edge of the wafer W is collected in the drain channel 26 and discharged as in the rinsing operation performed after the process with the first chemical. Further, the inner structural member 19, the middle structural member 20 and the outer structural member 21 are located in close relation with the very small gaps being defined between the upper edge portions of the inner structural member 19 and the middle structural member 20 and between the upper edge portions of the middle structural member 20 and the outer structural member 21. Further, the folded portion 21c of the outer structural member 21 horizontally overlaps with the upper edge portion 48b of the second guide portion 48, and the folded portion 48c of the second guide portion 48 horizontally overlaps with the upper edge portion 25b of the first guide portion 25. Thus, the process liquid is prevented from intruding into the space between the first guide portion 25 and the second guide portion 48 and the space between the second guide portion 48 and the outer structural member 21.

After the pure water is supplied to the wafer W for a predetermined period, the supply of the pure water from the nozzle 3 and the rear surface nozzle 8 is stopped. Then, the inner structural member 19, the middle structural member 20 and the outer structural member 21 are moved down to the lowermost position, whereby the upper edge portion 25b of the first guide member 25 of the inner structural member 19, the upper edge portion 48b of the second guide portion 48 of the middle structural member 20 and the upper edge portion 21b of the outer structural member 21 are located at a lower level than the wafer W as shown in FIG. 7. Thereafter, the rotation speed of the wafer W (spin chuck 1) is increased to the predetermined high rotation speed to perform the drying operation for a predetermined period to dry the wafer W by spinning out the rinse liquid adhering to the surfaces of the rinsed wafer W by a centrifugal force. After the completion of the drying operation, the rotation of the wafer W by the spin chuck 1 is stopped, and the processed wafer W is unloaded from the spin chuck 1.

In the substrate processing apparatus, as describe above, the inner structural member 19, the middle structural member 20 and the outer structural member 21 can be moved up and down independently of each other. This makes it possible to locate the upper edge portions of the inner structural member 19, the middle structural member 20 and the outer structural member 21 at a higher level than the wafer W held by the spin chuck 1, to locate only the upper edge portion 21b of the outer structure member 21 at a higher level than the wafer W held by the spin chuck 1, to locate only the upper edge portion 25b of the first guide portion 25 of the inner structural member 19 at a lower level than the wafer W held by the spin chuck 1, and to locate the upper edge portions of the inner structural member 19, the middle structural member 20 and the outer structural member 21 at a lower level than the wafer W held by the spin chuck 1 by moving up and down the structural members 19, 20, 21.

During the supply of the first chemical to the wafer W, only the upper edge portion 21b of the outer structural member 21 is located at a higher level than the wafer W held by the spin chuck 1. Thus, the opening is defined between the upper edge portion 48b of the second guide portion 48 of the middle structural member 20 and the upper edge portion 21b of the outer structural member 21 in opposed relation to the peripheral edge surface of the wafer W, so that the first chemical spun out to be scattered radially outward from the peripheral edge of the wafer W can be introduced into the space between the middle structural member 20 and the outer structural member 21. Then, the introduced first chemical is guided by the outer structural member 21 to be collected in the outer recovery channel 52 and recovered from the outer recovery channel 52 into the recovery tank through the recovery mechanism 53.

In addition, the outer recovery channel 52 in which the first chemical is recovered is isolated from the inner recovery channel 27 as shown in FIG. 8 during the supply of the first chemical to the wafer W (during the recovery of the first chemical), which eliminates the possibility that the second chemical flows into the outer recovery channel 52 from the inner recovery channel 27 due to the capillary phenomenon. Therefore, a process liquid different from the first chemical is prevented from flowing into the outer recovery channel 52. As a result, the purity of the first chemical recovered in the outer recovery channel 52 can be improved.

During the supply of the second chemical to the wafer W, only the upper edge portion 25b of the first guide portion 25 of the inner structural member 19 is located at a lower level than the wafer W held by the spin chuck 1. Thus, the opening is defined between the upper edge portion of the inner structural member 19 and the upper edge portion 48b of the second guide portion 48 of the middle structural member 20 in opposed relation to the peripheral edge surface of the wafer W, so that the second chemical spun out to be scattered radially outward from the peripheral edge of the wafer W can be introduced into the space between the inner structural member 19 and the middle structural member 20. Then, the introduced second chemical is guided by the middle structural member 20 to be collected in the inner recovery channel 27 and recovered from the inner recovery channel 27 into the recovery tank through the recovery mechanisms 35.

In addition, the inner recovery channel 27 in which the second chemical is recovered is isolated from the outer recovery channel 52 as shown in FIG. 10 during the supply of the second chemical to the wafer W (during the recovery of the second chemical), which eliminates the possibility that the first chemical flows into the inner recovery channel 27 from the outer recovery channel 52 due to the capillary phenomenon. Therefore, a process liquid different from the second chemical is prevented from flowing into the inner recovery channel 27. As a result, the purity of the second chemical recovered in the inner recovery channel 27 can be improved.

During the supply of the pure water to the wafer W, the upper edge portions of the inner structural member 19, the middle structural member 20 and the outer structural member 21 are located at a higher level than the wafer W held by the spin chuck 1. Thus, the pure water scattered radially outward from the wafer W is captured by the inner surface of the first guide portion 25 of the inner structural member 19, and guided by the first guide portion 25 to be collected in the drain channel 26. At this time, the inner structural member 19, the middle structural member 20 and the outer structural member 21 are located in close relation with the very small gaps being defined between the upper edge portions of the inner structural member 19 and the middle structural member 20 and between the upper edge portions of the middle structural member 20 and the outer structural member 21, whereby the process liquid is prevented from intruding into the space between the first guide portion 25 and the second guide portion 48 and the space between the second guide portion 48 and the outer structural member 21. Further, the inner structural member 19, the middle structural member 20 and the outer structural member 21 do not contact with each other, which eliminates the possibility that particles are generated due to the contact of these members 19, 20, 21 (by abrasion of the members 19, 20, 21 due to the contact).

During the supply of the second chemical and the pure water to the wafer W, there is no particular need to move up the outer structural member 21, but the outer structural member 21 can be located at the same position as assumed for guiding and recovering the first chemical. Therefore, there is no need to provide a greater space above the spin chuck 1, the height of the apparatus is correspondingly reduced.

By the folded portion 21c of the outer structural member 21, a process liquid different from the first chemical is prevented from intruding into the space between the second guide portion 48 and the outer structural member 21. By the folded portion 48c of the second guide portion 48 of the middle structural member 20, a process liquid different from the second chemical is prevented from intruding into the space between the first guide portion 25 and the second guide portion 48. Therefore, the purity of the first chemical recovered in the outer recovery channel 52 and the purity of the second chemical recovered in the inner recovery channel 27 can be further improved. In addition, the folded portion 21c and the folded portion 48c are respectively unitary with the outer structural member 21 and the middle structural member 20. Therefore, the construction of the apparatus can be simplified without increase in the number of the components.

When the process is shifted from the first chemical process step to the rinsing step, the inner structural member 19 and the middle structural member 20 are moved up in synchronization with the very small gap being defined between the upper edge portion 25b of the first guide portion 25 of the inner structural member 19 and the upper edge portion 48b of the second guide portion 48 of the middle structural member 20. Accordingly, even when the rotation of the wafer W by the spin chuck 1 and the supply of the first chemical are continued during the shift, the process liquid scattered from the wafer W is prevented from intruding into the space between the first guide portion 25 and the second guide portion 48. Therefore, the second chemical guided by the second guide portion 48 and recovered in the inner recovery channel 27 is prevented from being contaminated with the first chemical without reduction of the process throughput. As a result, the purity of the second chemical recovered in the inner recovery channel 27 can be improved. Therefore, the process of the wafer W can be properly performed even by reusing the recovered second chemical.

When the process is shifted from the rinsing step to the drying step, the inner structural member 19, the middle structural member 20 and the outer structural member 21 are moved down in synchronization with the very small gaps being defined between the upper edge portions 25b of the first guide portion 25 and the upper edge portion 48b of the second guide portion 48 and between the upper edge portion 48b of the second guide portion 48 and the upper edge portion 21b of the outer structural member 21. Accordingly, even when the rotation of the wafer W by the spin chuck 1 and the supply of the pure water are continued, the pure water scattered from the wafer W is prevented from intruding into the space between the first guide portion 25 and the second guide portion 48 and the space between the second guide portion 48 and the outer structural member 21. Therefore, where the first or second chemical guided by the second guide portion 48 or the outer structural member 21 is recovered, the recovered first or second chemical is prevented from being contaminated with the pure water to be spun out without reduction of the process throughput. As a result, the purities of the recovered first and second chemicals can be improved. Therefore, the process of the wafer W can be properly performed even by reusing the recovered first or second chemical.

During the process of the wafer W, the drain channel 26 is constantly evacuated. Therefore, an atmosphere containing a mist of the pure water used for washing away the first chemical or the second chemical from the wafer W can be sucked from the periphery of the wafer W into the drain channel 26 thereby to be removed in the rinsing step.

Since the first guide portion 25 is provided upright between the drain channel 26 and the inner recovery channel 27, the drain channel 26 and the inner recovery channel 27 are isolated from each other by the first guide portion 25. Further, no evacuation mechanism for forced evacuation is connected to the inner recovery channel 27, so that the inner recovery channel 27 is not forcibly evacuated. Accordingly, even when the drain channel 26 is evacuated, the inner recovery channel 27 is not evacuated, so that an air stream flowing into the inner recovery channel 27 from the outside does not occur. Therefore, droplets of the pure water and the first chemical are prevented from intruding into the inner recovery channel 27. This improves the purity of the second chemical recovered from the inner recovery channel 27 while permitting the forced evacuation of the drain channel 26.

When the second chemical is guided by the second guide portion 48, i.e., when the second chemical is recovered from the inner recovery channel 27, the upper edge portion 25b of the first guide portion 25 is located in the vicinity of the spin base 5 of the spin chuck 1, so that a gap between the upper edge portion 25b of the first guide portion 25 and the spin base 5 is narrowed as shown in FIG. 10. Thus, the second chemical is prevented from being sucked into the drain channel 26 by the suction force generated by the evacuation of the drain channel 26. Therefore, the recovery rate of the second chemical can be improved.

A simple arrangement including the first guide portion 25 provided integrally with the drain channel 26 and the inner recovery channel 27 makes it possible to isolate the drain channel 26 and the inner recovery channel 27 from each other, so that the evacuation of the inner recovery channel 27 can be prevented which may otherwise occur due to the evacuation of the drain channel 26. As a result, the purity of the second chemical recovered in the inner recovery channel 27 can be improved without complication of the construction and an associated cost increase.

Further, the drain channel 26 and the outer recovery channel 52 are isolated from each other by the second guide portion 48, and a mechanism for forcibly evacuating the outer recovery channel 52 is not connected to the outer recovery channel 52. Accordingly, even when the drain channel 26 is evacuated, the outer recovery channel 52 is not evacuated, so that an air stream flowing into the outer recovery channel 52 from the outside does not occur. Therefore, droplets of the pure water and the second chemical are prevented from intruding into the outer recovery channel 52. This improves the purity of the first chemical recovered from the outer recovery channel 52 while permitting the forced evacuation of the drain channel 26.

In addition, when the first chemical is guided by the outer structural member 21, i.e., when the first chemical is recovered from the outer recovery channel 52, the upper edge portion 25b of the first guide portion 25 and the upper edge portion 48b of the second guide portion 48 are located in the vicinity of the spin base 5 of the spin chuck 1, so that the gap between the upper edge portion 25b of the first guide portion 25 and the spin base 5 and a gap between the upper edge portion 48b of the second guide portion 48 and the spin base 5 are narrowed as shown in FIG. 8. Thus, the first chemical is prevented from being sucked into the drain channel 26 by the suction force generated by the evacuation of the drain channel 26. As a result, the recovery rate of the first chemical can be improved.

Figure 11:
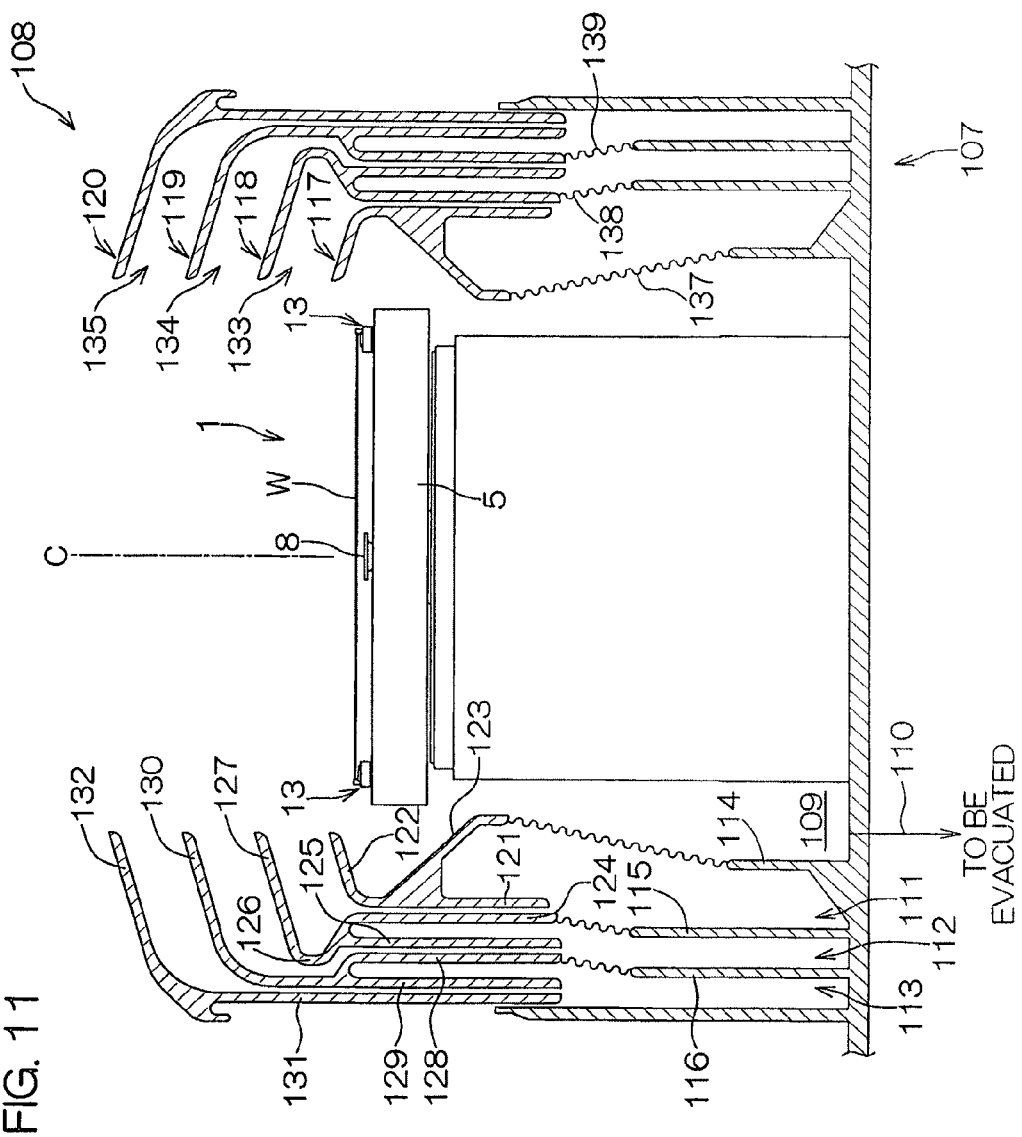
FIG. 11 is a simplified sectional view illustrating a construction of a substrate processing apparatus according to another embodiment of the present invention.

FIG. 11 is a simplified sectional view illustrating a construction of a substrate processing apparatus according to another embodiment of the present invention.

The substrate processing apparatus according to this embodiment is adapted to supply a first chemical, a second chemical, a third chemical and pure water as a process liquid in a predetermined order to a wafer W held by a spin chuck 1 to perform a cleaning process on the wafer W.

The spin chuck 1 is accommodated in a bottomed hollow cylindrical cup 107. A splash guard 108 is provided above the cup 107 vertically movably with respect to the cup 107.

A drain channel 109 for draining the process liquid used for the process of the wafer W is provided on a bottom portion of the cup 107 annularly about a rotation axis C of the wafer W. The drain channel 109 is connected to an evacuation line 110 for draining the process liquid collected in the drain channel 109 and forcibly evacuating air from the drain channel 109. A first recovery channel 111, a second recovery channel 112 and a third recovery channel 113 each having an annular shape for recovering the process liquid used for the process of the wafer W are provided on the bottom portion of the cup 107 as triply surrounding the drain channel 109.

The drain channel 109 and the first recovery channel 111 are separated by a hollow cylindrical partition wall 114 provided therebetween. The first recovery channel 111 and the second recovery channel 112 are separated by a hollow cylindrical partition wall 115 provided therebetween, and the second recovery channel 112 and the third recovery channel 113 are separated by a hollow cylindrical partition wall 116 provided therebetween.

The splash guard 108 includes four shade members 117, 118, 119, 120 having different sizes and disposed in vertically overlapping relation. A lift mechanism (not shown), for example, including a servo motor, a ball screw mechanism and the like is connected to the splash guard 108. The splash guard 108 is moved up and down (vertically) with respect to the cup 107 by the lift mechanism.

The shade members 117 to 120 each have a generally rotationally symmetrical shape about the rotation axis of the wafer W.

The shade member 117 includes a hollow cylindrical portion 121 having a center axis aligning with the rotation axis C of the wafer W, an upper tilt portion 122 extending obliquely upward from an upper edge of the cylindrical portion 121 toward the center thereof (toward the rotation axis C of the wafer W), and a lower tilt portion 123 extending obliquely downward from the upper edge of the cylindrical portion 121 toward the center thereof. A lower edge of the cylindrical portion 121 is located above the first recovery channel 111, and a lower edge of the lower tilt portion 123 is located above the drain channel 109. The cylindrical portion 121 and the lower tilt portion 123 each have a length such that the lower edge thereof is not brought into contact with a bottom surface of the cup 107 when the splash guard 108 is moved down to the lowermost retracted position.

The shade member 118 is provided around the cylindrical portion 121 of the shade member 117. The shade member 118 includes hollow cylindrical portions 124, 125 each having a center axis aligning with the rotation axis C of the wafer W, a connection portion 126 connecting upper edges of the cylindrical members 124, 125 and having a generally U-shaped cross section which opens toward the rotation axis of the wafer W, and an upper tilt portion 127 extending obliquely upward from an upper edge of the connection portion 126 toward the center thereof. A lower edge of the cylindrical portion 124 disposed on an inner side (closer to the center) is located above the first recovery channel 111, and a lower edge of the cylindrical portion 125 disposed on an outer side is located above the second recovery channel 112. The cylindrical portions 124, 125 each have a length such that the lower edge thereof is not brought into contact with the bottom surface of the cup 107 when the splash guard 108 is moved down to the lowermost retracted position.

The shade member 119 is provided around the cylindrical portion 125 of the shade member 118. The shade member 119 includes hollow cylindrical portions 128, 129 each having a center axis aligning with the rotation axis C of the wafer W, and an upper tilt portion 130 extending obliquely upward toward the center thereof from an upper edge of the cylindrical portion 129 disposed on an outer side. A lower edge of the cylindrical portion 128 disposed on an inner side is located above the second recovery channel 112, and a lower edge of the outer cylindrical portion 129 is located above the third recovery channel 113. The cylindrical portions 128, 129 each have a length such that the lower edge thereof is not brought into contact with the bottom surface of the cup 107 when the splash guard 108 is moved down to the lowermost retracted position.

The shade member 120 is provided around the cylindrical portion 129 of the shade member 119. The shade member 120 includes a hollow cylindrical portion 131 having a center axis aligning with the rotation axis C of the wafer W, and an upper tilt portion 132 extending obliquely upward from an upper edge of the cylindrical portion 131 toward the center thereof. The cylindrical portion 131 is located above the third recovery channel 113, and has a length such that the lower edge thereof is not brought into contact with the bottom surface of the cup 107 when the splash guard 108 is moved down to the lowermost retracted position.

Upper edges of the upper tilt portions 122, 127, 130, 132 are located on a cylindrical plane having a center axis aligning with the rotation axis of the wafer W as being spaced vertically along the rotation axis of the wafer W. Thus, an annular first recovery port 133 which receives the process liquid (first chemical) scattered from the wafer W is defined between the upper edge of the upper tilt portion 122 and the upper edge of the upper tilt portion 127. Further, an annular second recovery port 134 which receives the process liquid (second chemical) scattered from the wafer W is defined between the upper edge of the upper tilt portion 127 and the upper edge of the upper tilt portion 130, and an annular third recovery port 135 which receives the process liquid (third chemical) scattered from the wafer W is defined between the upper edge of the upper tilt portion 130 and the upper edge of the upper tilt portion 132.

A bellows 137 is provided between the lower tilt portion 123 of the shade member 117 and the partition wall 114. Upper and lower edge portions of the bellows 137 are respectively connected to a lower edge portion of the lower tilt portion 123 and an upper edge portion of the partition wall 114. A bellows 138 is provided between the inner cylindrical portion 124 of the shade member 118 and the partition wall 115. Upper and lower edge portions of the bellows 138 are respectively connected to a lower edge portion of the cylindrical portion 124 and an upper edge portion of the partition wall 115. Further, a bellows 139 is provided between the inner cylindrical portion 128 of the shade member 119 and the partition wall 116. Upper and lower edge portion of the bellows 139 are respectively connected to a lower edge of the cylindrical portion 128 and an upper edge of the partition wall 116. Thus, the drain channel 109, the first recovery channel 111, the second recovery channel 112 and the third recovery channel 113 are isolated from each other between the cup 107 and the splash guard 108 irrespective of the position of the splash guard 108.

With this arrangement, the splash guard 108 is vertically moved to bring the first recovery port 133 into opposed relation with the peripheral edge surface of the wafer W. When the first chemical is supplied to the wafer W rotated by the spin chuck 1 in this state, the first chemical scattered from the peripheral edge of the wafer W enters the first recovery port 133 thereby to be collected in the first recovery channel 111. Then, the first chemical collected in the first recovery channel 111 is recovered in a recovery tank through a recovery mechanism (not shown) connected to the first recovery channel 111.

When the second chemical is supplied to the wafer W rotated by the spin chuck 1 with the second recovery port 134 being opposed to the peripheral edge surface of the wafer W, the second chemical scattered from the peripheral edge of the wafer W enters the second recovery port 134 and is recovered in a recovery tank from the second recovery channel 112.

When the third chemical is supplied to the wafer W rotated by the spin chuck 1 with the third recovery port 135 being opposed to the peripheral edge surface of the wafer W, the third chemical scattered from the peripheral edge of the wafer W enters the third recovery port 135 and is recovered in a recovery tank from the third recovery channel 113.

In a rinsing step in which the wafer W processed with the first chemical, the second chemical and the third chemical is rinsed with the pure water, the splash guard 108 is vertically moved to bring a gap between the upper tilt portion 122 and the lower tilt portion 123 of the shade member 117 into opposed relation to the peripheral edge surface of the wafer W. When the pure water is supplied to the wafer W rotated by the spin chuck 1 in this state, the pure wafer scattered from the wafer W is collected in the drain channel 109 thereby to be discharged together with the atmosphere of the drain channel 109 through the evacuation line 110.

In this step, the drain channel 109 is constantly evacuated, so that an atmosphere containing a mist of the pure water used for washing away the first chemical, the second chemical or the third chemical from the wafer W is sucked into the drain channel 109 from the periphery of the wafer W thereby to be removed.

With the provision of the bellows 137, 138, 139, the drain channel 109, the first recovery channel 111, the second recovery channel 112 and the third recovery channel 113 are isolated from each other. Therefore, even when the drain channel 109 is evacuated, there is no possibility that the first recovery channel 111, the second recovery channel 112 and the third recovery channel 113 are accordingly indirectly evacuated. Hence, air streams flowing into the first recovery channel 111, the second recovery channel 112 and the third recovery channel 113 from the outside do not occur. This improves the purities of the first chemical recovered from the first recovery channel 111, the second chemical recovered from the second recovery channel 112 and the third chemical recovered from the third recovery channel 113 while permitting the forced evacuation of the drain channel 109.

In addition, the drain channel 109, the first recovery channel 111, the second recovery channel 112 and the third recovery channel 113 are isolated from each other by a simple arrangement including the bellows 137 provided between the lower tilt portion 123 of the shade member 117 and the partition wall 114, the bellows 138 provided between the inner cylindrical portion 124 of the shade member 118 and the partition wall 115 and the bellows 139 provided between the inner cylindrical portion 128 of the shade member 119 and the partition wall 116. Therefore, the apparatus is free from a significant cost increase even with this arrangement.

In the rinsing step, a large gap is defined between the spin base 5 and the splash guard 108 as shown in FIG. 11. During the process with the first chemical, on the other hand, the upper edge portion of the upper tilt portion 122 of the shade member 117 is located in the vicinity of the spin base 5 of the spin chuck 1 with the first recovery port 133 being opposed to the peripheral edge surface of the wafer W, whereby the gap between the spin base 5 and the splash guard 108 is narrowed. Thus, the first chemical is prevented from being sucked into the drain channel 109 even when the drain channel 109 is evacuated. Therefore, the recovery rate of the first chemical can be improved. Further, the upper edge portion of the upper tilt portion 127 of the shade member 118 is located in the vicinity of the spin base 5 during the process with the second chemical, and the upper tilt portion 130 of the shade member 119 is located in the vicinity of the spin base 5 during the process with the third chemical. Therefore, the second chemical and the third chemical, like the first chemical, are prevented from being sucked into the drain channel 109, so that the recovery rates of the second chemical and the third chemical can be improved.

While the embodiments of the present invention have thus been described in detail, it should be understood that these embodiments are merely illustrative of the technical principles of the present invention but not limitative of the invention. The spirit and scope of the present invention are to be limited only by the appended claims.

In the first embodiment described above, the first chemical, the second chemical and the pure water are used for the process by way of example, but a third chemical different from the first and second chemicals may be additionally used for the process of the wafer W, and the third chemical used for the process may be recovered. In this case, an additional structural member having the same construction as the outer structural member 21 for guiding the third chemical is provided outside the outer structural member 21, and a recovery channel for recovering the third chemical guided by the additional structural member is provided in the outer structural member 21. Thus, the existing inner, middle and outer structural members 19, 20, 21 are utilized together with the additional structural member for the process. Therefore, a significant cost increase can be avoided. Similarly, where four or more chemicals are used for the process of the wafer W and recovered, a significant cost increase can be avoided by the aforesaid arrangement. That is, the apparatus can be modified so as to recover increased types of chemicals without a significant cost increase. Further, when the process liquid is guided by the inner structural member 19 or the middle structural member 20, there is no particular need to move up the additional outermost structural member, thereby preventing the increase in the height of the apparatus.

In the first embodiment described above, the process with the first chemical is first performed and, after the rinsing operation, the process with the second chemical is performed by way of example. Alternatively, the process with the second chemical may be first performed and, after the rinsing operation, the process with the first chemical may be performed. In this case, when the process is shifted from the rinsing step to the process with the second chemical, the inner structural member 19 and the middle structural member 20 are moved down in synchronization with the very small gap being defined between the upper edge portion 25b of the first guide portion 25 of the inner structural member 19 and the upper edge portion 48b of the second guide portion 48 of the middle structural member 20 from the state in which the inner structural member 19, the middle structural member 20 and the outer structural member 21 are located at the uppermost position. Thus, the process liquid (pure water) scattered from the wafer W is prevented from intruding into the space between the first guide portion 25 and the second guide portion 48 even when the rotation of the wafer W by the spin chuck 1 is continued during the shift. Therefore, the second chemical guided by the second guide portion 48 and recovered in the inner recovery channel 27 is prevented from being contaminated with the pure water without the reduction of the process throughput. As a result, the purity of the second chemical recovered in the inner recovery channel 27 can be improved. Thus, the process of the wafer W can be properly performed even by reusing the recovered second chemical.

In the embodiments described above, the apparatus is adapted to perform the cleaning process on the wafer W by way of example, but the process to be performed by the inventive apparatus is not limited to the cleaning process. For example, the invention is applicable to an etching process apparatus for removing an unnecessary thin film from a surface of a wafer W with the use of an etching liquid, a polymer removing apparatus for removing an unnecessary polymer residue from a surface of a wafer W with the use of a polymer removing chemical, a resist applying apparatus for applying a resist liquid on a surface of a wafer W for forming a resist film, and a developing apparatus for supplying a developing chemical to a surface of a wafer W for developing a resist film.

What is claimed is:

1. A substrate processing apparatus comprising:
a substrate holding mechanism which generally horizontally holds and rotates a substrate;
a process liquid supplying mechanism for selectively supplying a first process liquid and a second process liquid to the substrate held by the substrate holding mechanism;
a first guide portion provided around the substrate holding mechanism for guiding the first process liquid scattered from the substrate rotated by the substrate holding mechanism to cause the first process liquid to flow down;
a second guide portion provided around the substrate holding mechanism for guiding the second process liquid scattered from the substrate rotated by the substrate holding mechanism to cause the second process liquid to flow down;
a drain channel for draining the first process liquid guided by the first guide portion;
a first recovery channel for recovering the second process liquid guided by the second guide portion;
an evacuation mechanism for forcibly evacuating the drain channel;
a driving mechanism for moving up and down the first guide portion and the second guide portion;
a first partition wall separating the drain channel and the first recover channel; and
a first isolation member provided between the drain channel and the first recovery channel and connected to the first guide portion and the first partition wall, the first isolation member being cooperative with the first guide portion and the first partition wall to atmospherically isolate the drain channel and the recovery channel from each other, wherein
the drain channel and the first recovery channel are atmospherically isolated from each other and the recovery channel is not forcibly evacuated.

2. A substrate processing apparatus as set forth in claim 1, wherein
the first guide portion is movable to a first position at which a relatively small gap is defined between the first guide portion and the substrate holding mechanism and to a second position at which a relatively large gap is defined between the first guide portion and the substrate holding mechanism and, when the second process liquid is guided by the second guide portion, the first guide portion is located at the first position.

3. The substrate processing apparatus as set forth in claim 1, wherein the first isolation member includes a bellows.

4. The substrate processing apparatus as set forth in claim 1, wherein
the process liquid supplying mechanism selectively supplies the first process liquid, the second process liquid and a third process liquid to the substrate held by the substrate holding mechanism, and
the substrate processing apparatus further comprises a third guide portion provided around the substrate holding mechanism for guiding the third process liquid scattered from the substrate rotated by the substrate holding mechanism to cause the third process liquid to flow down, a second recovery channel for recovering the third process liquid guided by the third guide portion, a second partition wall separating the first recovery channel and the second recovery channel, and a second isolation member provided between the first recovery channel and the second recovery channel and connected to the second guide portion and the second partition wall, the second isolation member being cooperative with the second guide portion and the second partition wall to atmospherically isolate the first recovery channel and the second recovery channel from each other, wherein the driving mechanism moves up and down the first guide portion, the second guide portion and the third guide portion.

5. The substrate processing apparatus as set forth in claim 4, wherein the second isolation member includes a bellows.

* * * * *